US012805382B2

(12) United States Patent
Hung et al.

(10) Patent No.: US 12,805,382 B2
(45) Date of Patent: Nov. 17, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Wensen Hung, Zhubei City (TW); Yen-Fu Su, Hsinchu (TW); Tsung-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 370 days.

(21) Appl. No.: 18/482,954

(22) Filed: Oct. 9, 2023

(65) Prior Publication Data

US 2025/0118608 A1 Apr. 10, 2025

(51) Int. Cl.

*H10W 76/42* (2026.01)
*H10W 42/00* (2026.01)
*H10W 74/01* (2026.01)
*H10W 74/10* (2026.01)

(52) U.S. Cl.

CPC ......... *H10W 76/42* (2026.01); *H10W 42/121* (2026.01); *H10W 74/01* (2026.01); *H10W 74/117* (2026.01)

(58) Field of Classification Search

CPC .... H10W 42/121; H10W 76/42; H10W 76/40
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |

(Continued)

FOREIGN PATENT DOCUMENTS

| | | |
|---|---|---|
| TW | 202310216 A | 3/2023 |
| TW | 202312387 A | 3/2023 |

*Primary Examiner* — Yu-Hsi D Sun
(74) *Attorney, Agent, or Firm* — Slater Matsil, LLP

(57) ABSTRACT

A semiconductor package and the method of forming the same are provided. The semiconductor package may include a substrate, an integrated circuit package component having a semiconductor die bonded to the substrate, and a ring structure on the substrate, wherein the ring structure may encircle the integrated circuit package component in a top-down view. The ring structure may comprise a first attached segment, a second attached segment attached to the substrate by an adhesive, and a first suspended segment between the first attached segment and the second attached segment. The first suspended segment may be suspended over the substrate. The first attached segment and the second attached segment may be spaced apart from the package component by a first distance and a second distance, respectively. The first suspended segment may be spaced apart from the package component by a third distance different from the first distance and the second distance.

20 Claims, 32 Drawing Sheets

300A

(56) References Cited

U.S. PATENT DOCUMENTS

| | | | |
|---|---|---|---|
| 2023/0063295 A1 | 3/2023 | Yang et al. | |
| 2023/0071418 A1 | 3/2023 | Hung et al. | |
| 2023/0144388 A1* | 5/2023 | Kwon .................. | H10W 40/22<br>257/668 |

* cited by examiner

INTEGRATED CIRCUIT PACKAGES AND METHODS OF FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
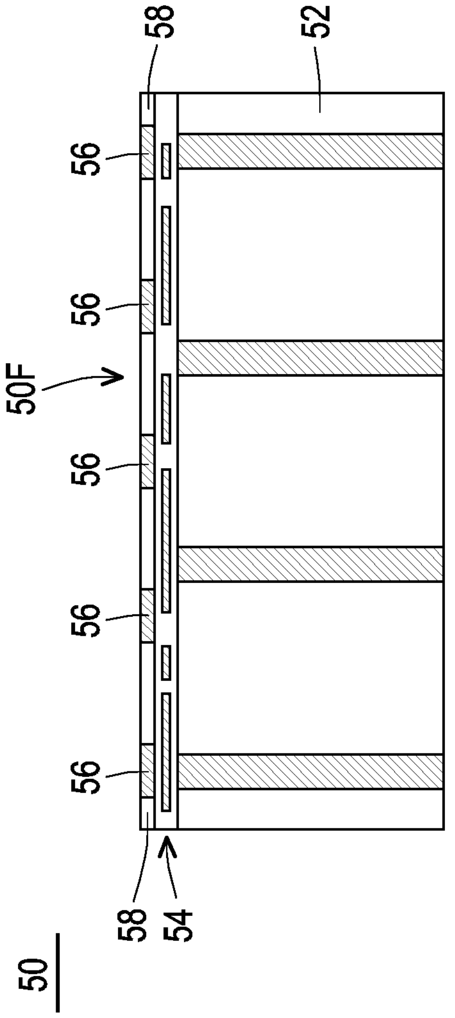
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an integrated circuit package comprises an integrated circuit package component and a stiffener ring on a package substrate. The stiffener ring may encircle the integrated circuit package component in a top-down view. The stiffener ring may comprise attached segments and suspended segments. The attached segments may be attached to the package substrate by an adhesive. The suspended segments may be suspended over the package substrate, wherein bottom surfaces of the suspended segments are free of the adhesive. By using such a stiffener ring, the integrated circuit package component and the package substrate may have more freedom of movement when heated during operation, which may prevent or reduce the delamination and/or the cracking of an underfill in the integrated circuit package component and/or the delamination and/or the cracking of an underfill between the integrated circuit package component and the package substrate. As a result, the long-term reliability of the integrated circuit package comprising the stiffener ring may be improved.

FIG. 1 is a cross-sectional view of an integrated circuit die 50. Multiple integrated circuit dies 50 may be packaged in subsequent processing to form integrated circuit packages. Each integrated circuit die 50 may be a logic die (e.g., central processing unit (CPU), graphics processing unit (GPU), system-on-a-chip (SoC) die, microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof. The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward in FIG. 1) and an inactive surface (e.g., the surface facing downward in FIG. 1). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52. The interconnect structure 54 electrically interconnects the devices of the semiconductor substrate 52 to form an integrated circuit and provides connections to the die connectors 56. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer, such as polybenzoxazole (PBO), polyimide, a benzocyclobuten (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The metallization layer(s) of the interconnect structure 54 may be formed by a damascene process, such as a single damascene process, a dual damascene process, or the like.

Die connectors 56 are at the front side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed.

A dielectric layer 58 is at the front side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, the like, or a combination thereof. The dielectric layer 58 may be formed, for example, by chemical vapor deposition (CVD), or the like. Initially, the dielectric layer 58 may bury the die connectors 56, such that the top surface of the dielectric layer 58 is above the top surfaces of the die connectors 56. The die connectors 56 may be exposed through the dielectric layer 58. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are coplanar (within process variations) and are exposed at the front side 50F of the integrated circuit die 50.

Figure 2A:
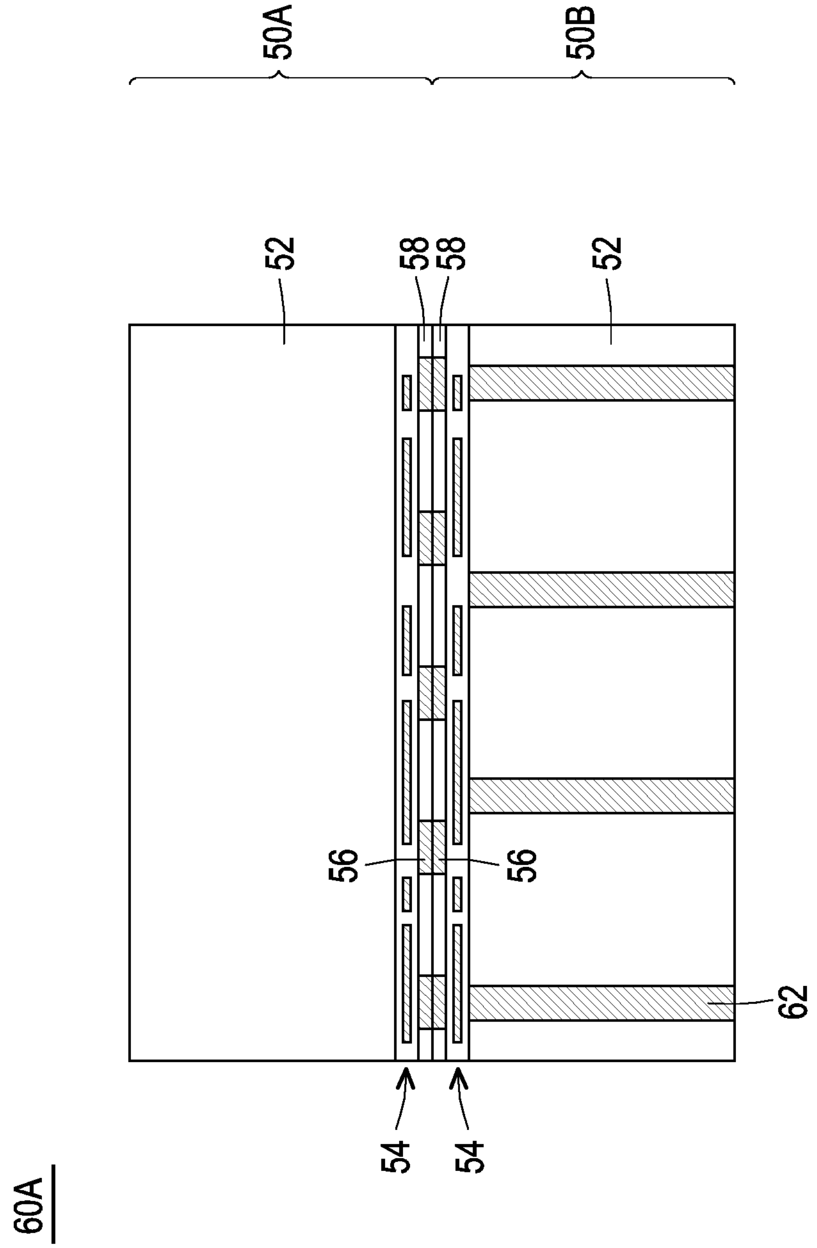
FIGS. 2A-2B are cross-sectional views of die stacks.
Figure 2B:
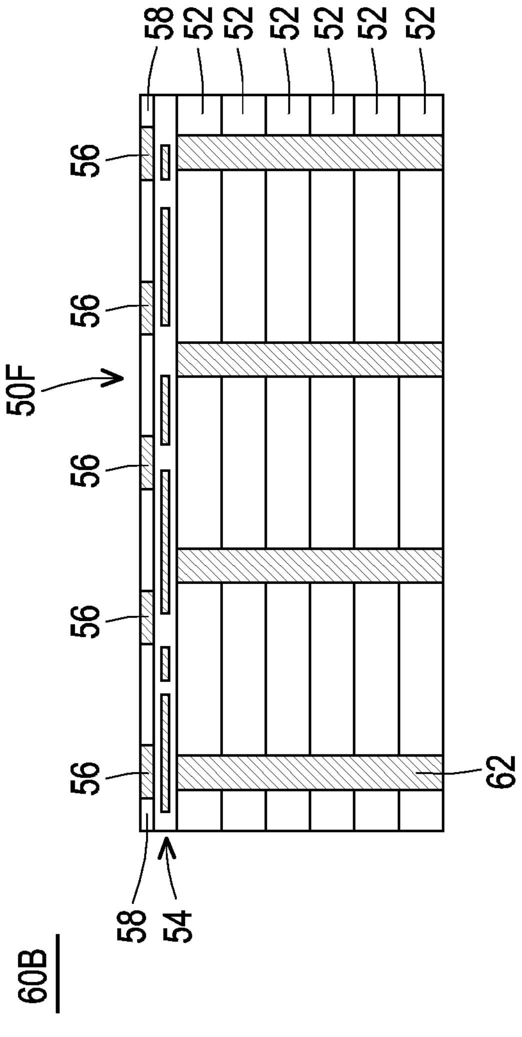

FIGS. 2A-2B are cross-sectional views of die stacks 60A, 60B, respectively. The die stacks 60A, 60B may each have a single function (e.g., a logic device, memory die, etc.), or may have multiple functions. In some embodiments, the die stack 60A is a logic device such as a system-on-integrated-chip (SoIC) device and the die stack 60B is a memory device such as high bandwidth memory (HBM) device.

As shown in FIG. 2A, the die stack 60A includes two bonded integrated circuit dies 50 (e.g., a first integrated circuit die 50A and a second integrated circuit die 50B). In some embodiments, the first integrated circuit die 50A is a logic die, and the second integrated circuit die 50B is an interface die. The interface die bridges the logic die to external memory dies, and translates commands between the logic die and the external memory dies. In some embodiments, the first integrated circuit die 50A and the second integrated circuit die 50B are bonded such that the active surfaces are facing each other (e.g., are "face-to-face" bonded). Conductive vias 62 may be formed through one of the integrated circuit dies 50 so that external connections may be made to the die stack 60A. The conductive vias 62 may be through-substrate vias (TSVs), such as through-silicon vias or the like. In the illustrated embodiment, the conductive vias 62 are formed in the second integrated circuit die 50B (e.g., the interface die). The conductive vias 62 extend through the semiconductor substrate 52 of the respective integrated circuit die 50, to be physically and electrically connected to the metallization layer(s) of the interconnect structure 54.

As shown in FIG. 2B, the die stack 60B is a stacked device that includes multiple semiconductor substrates 52. For example, the die stack 60B may be a memory device that includes multiple memory dies such as a hybrid memory cube (HMC) device, a high bandwidth memory (HBM) device, or the like. Each of the semiconductor substrates 52 may (or may not) have a separate interconnect structure 54. The semiconductor substrates 52 are connected by conductive vias 62, such as TSVs.

FIGS. 3-15C are views of intermediate stages in the manufacturing of integrated circuit packages 300A, in accordance with some embodiments. Multiple package regions 100P are illustrated, and an integrated circuit package component 200 may be formed in each of the package regions 100P, which may be used to form the integrated circuit packages 300A. FIGS. 3-15C illustrate the integrated circuit packages 300A as chip-on-wafer-on-substrate (CoWoS®) packages, such as CoWoS-L packages as an example, and it should be appreciated other types of packages may be used.

Figure 3:
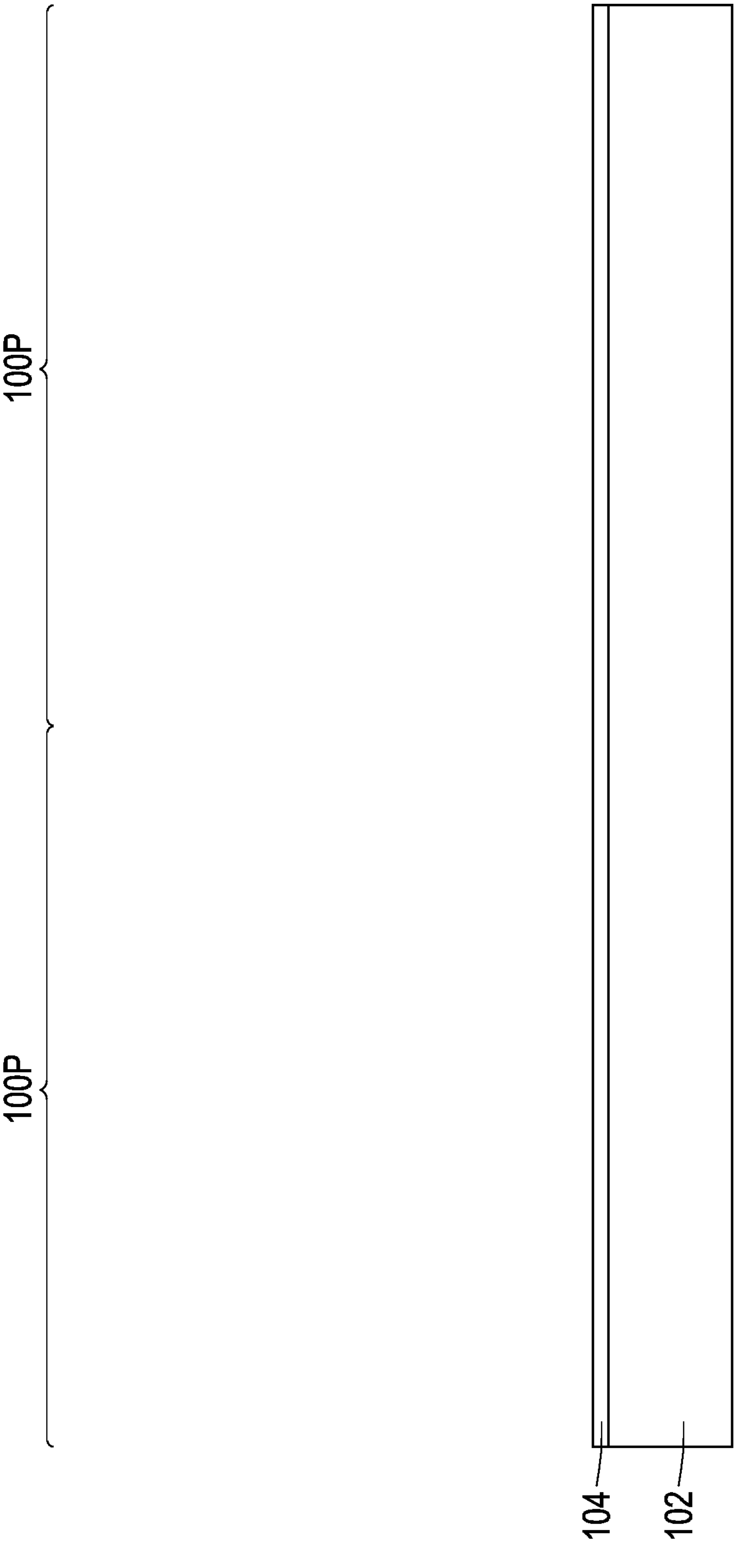
FIGS. 3, 4, 5, 6, 7, 8, 9, 10A, 10B, 11, 12, 13, 14A, 14B, 15A, 15B, 15C, 15D, 16A, 16B, 17A, 17B, 18A, 18B, 19A, 19B, 10B, 20A, 20B, and 20C are views of intermediate stages in the manufacturing of an integrated circuit package including a stiffener ring, in accordance with some embodiments.

In FIG. 3, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 4:
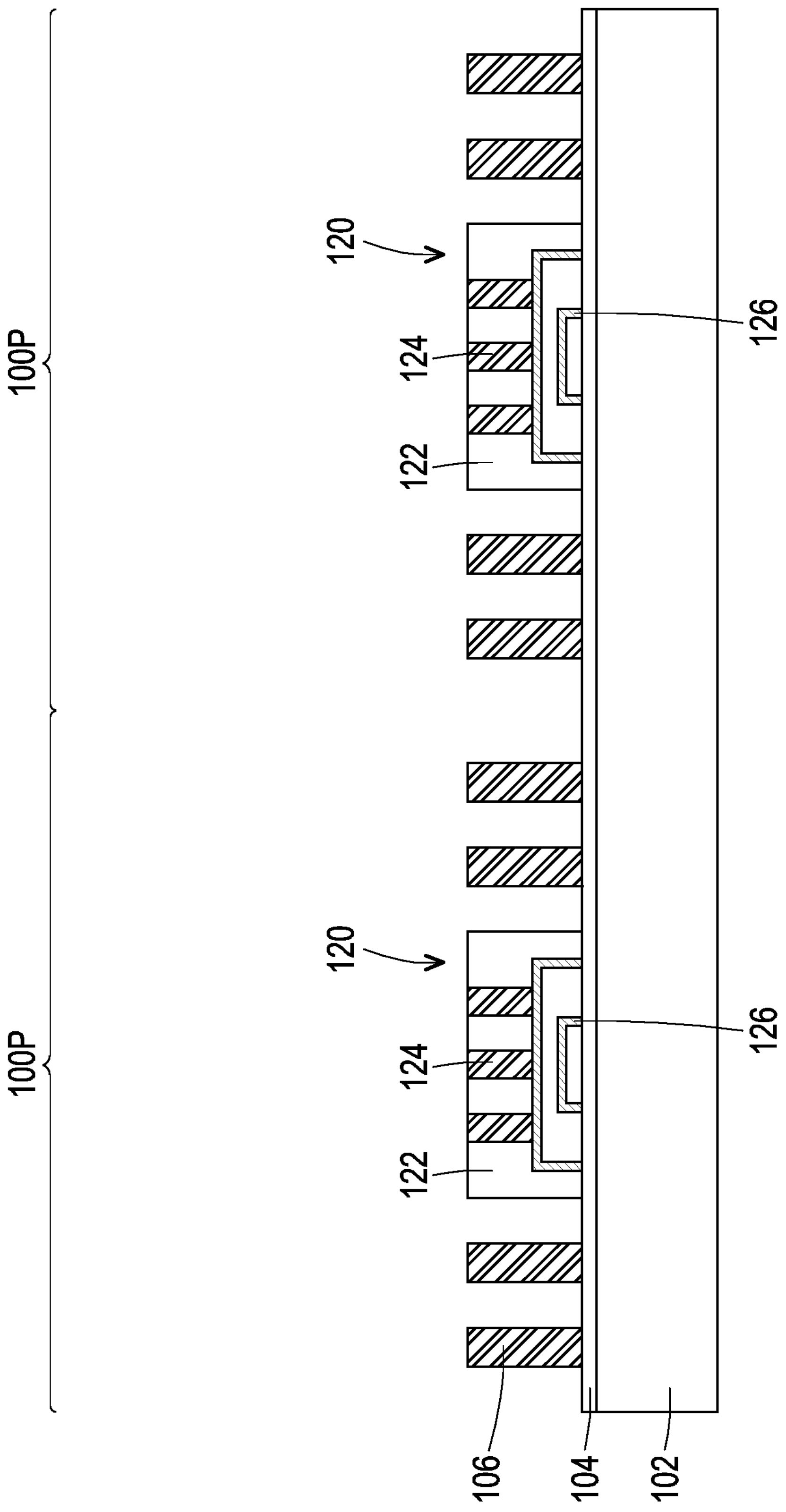

In FIG. 4, through vias 106 are formed over the carrier substrate 102 (e.g., on the release layer 104). As an example to form the through vias 106, a seed layer (not shown) is formed over the release layer 104. In some embodiments, the seed layer is a metal layer, which may be a single layer or a composite layer comprising a plurality of sub-layers formed of different materials. In an embodiment, the seed layer comprises a titanium layer and a copper layer over the titanium layer. The seed layer may be formed using, for example, physical vapor deposition (PVD) or the like. A photoresist is formed and patterned on the seed layer. The photoresist may be formed by spin coating or the like and may be exposed to light for patterning. The pattern of the photoresist corresponds to the through vias 106. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by an acceptable etching process, such as by wet or dry etching. The remaining portions of the seed layer and conductive material form the through vias 106.

Interconnection dies 120 are attached to the carrier substrate 102. Each interconnection die 120 may be a local silicon interconnect (LSI), a large scale integration package, an interposer die, or the like. In the illustrated embodiment, one interconnection die 120 is attached in each package region 100P. It should be appreciated that any quantity of interconnection dies 120 may be placed in the package regions 100P. The interconnection dies 120 may be placed by, e.g., a pick-and-place process. Each interconnection die 120 includes a substrate 122, with conductive features formed in and/or on the substrate 122. The substrates 122 may include a semiconductor substrate, one or more dielectric layer(s), or the like. Additionally, each interconnection die 120 may include through-substrate vias (TSVs) 124 that extend into or through the substrate 122, and may be coupled to the conductive features of the interconnection die 120. In the illustrated embodiment, the TSVs 124 are exposed at the back sides of the interconnection dies 120. In another embodiment, the substrates 122 may cover the TSVs 124 at the back sides of the interconnection dies 120.

In embodiments where the interconnection dies 120 are LSIs, the interconnection dies 120 may be bridge structures that include die bridges 126. The die bridges 126 may be metallization layers formed in and/or on, e.g., the substrate 122, and work to interconnect integrated circuit devices (subsequently described) to one another. As such, the LSI can be used to directly connect and allow communication between the integrated circuit devices. In such embodiments, the interconnection dies 120 can be placed in a region that is disposed between the subsequently bonded integrated circuit devices so that each of the interconnection dies 120 overlaps the overlying integrated circuit devices. In some embodiments, the interconnection dies 120 may further include logic devices and/or memory devices. The interconnection dies 120 are attached to the carrier substrate 102 such that the die bridges 126 face the carrier substrate 102.

Figure 5:
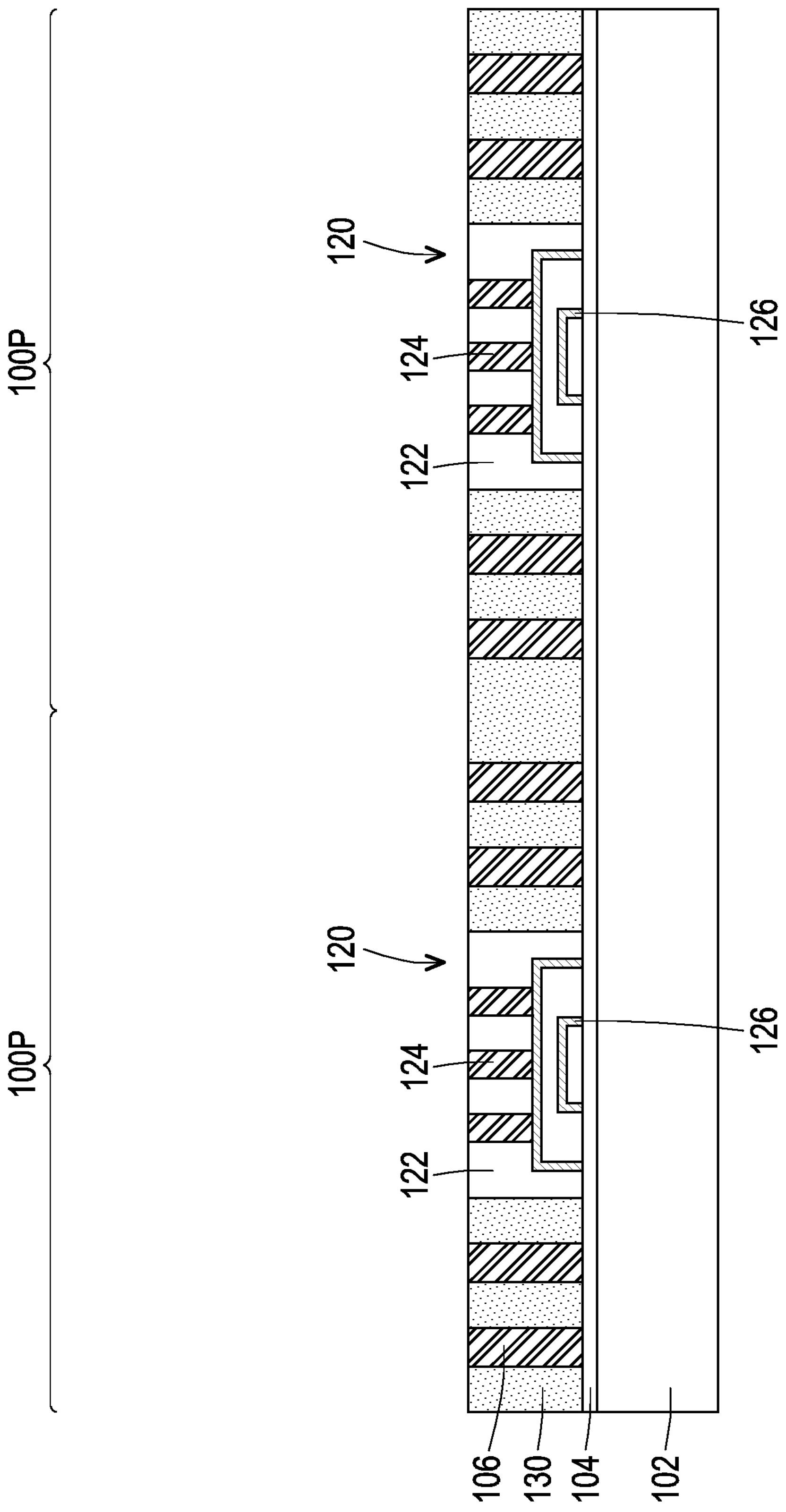

In FIG. 5, an encapsulant 130 is formed on and around the various components. After formation, the encapsulant 130 encapsulates the through vias 106 and the interconnection dies 120. The encapsulant 130 may be a molding compound, epoxy, or the like. The encapsulant 130 may be applied by compression molding, transfer molding, or the like, and may be formed over the carrier substrate 102 such that the through vias 106 and/or the interconnection dies 120 are buried or covered. The encapsulant 130 is further formed in gap regions between the interconnection dies 120 and the through vias 106. The encapsulant 130 may be applied in liquid or semi-liquid form and then subsequently cured.

A planarization process may optionally be performed on the encapsulant 130 to expose the through vias 106 and the TSVs 124. The planarization process may also remove material of the through vias 106, the substrates 122, and/or the TSVs 124 until the TSVs 124 and the through vias 106 are exposed. The top surfaces of the through vias 106, the substrates 122, the TSVs 124, and the encapsulant 130 are substantially coplanar (within process variations) after the planarization process. The planarization process may be, for example, a CMP, a grinding process, or the like. In some embodiments, the planarization may be omitted, for example, if the through vias 106 and/or the TSVs 124 are already exposed.

Figure 6:
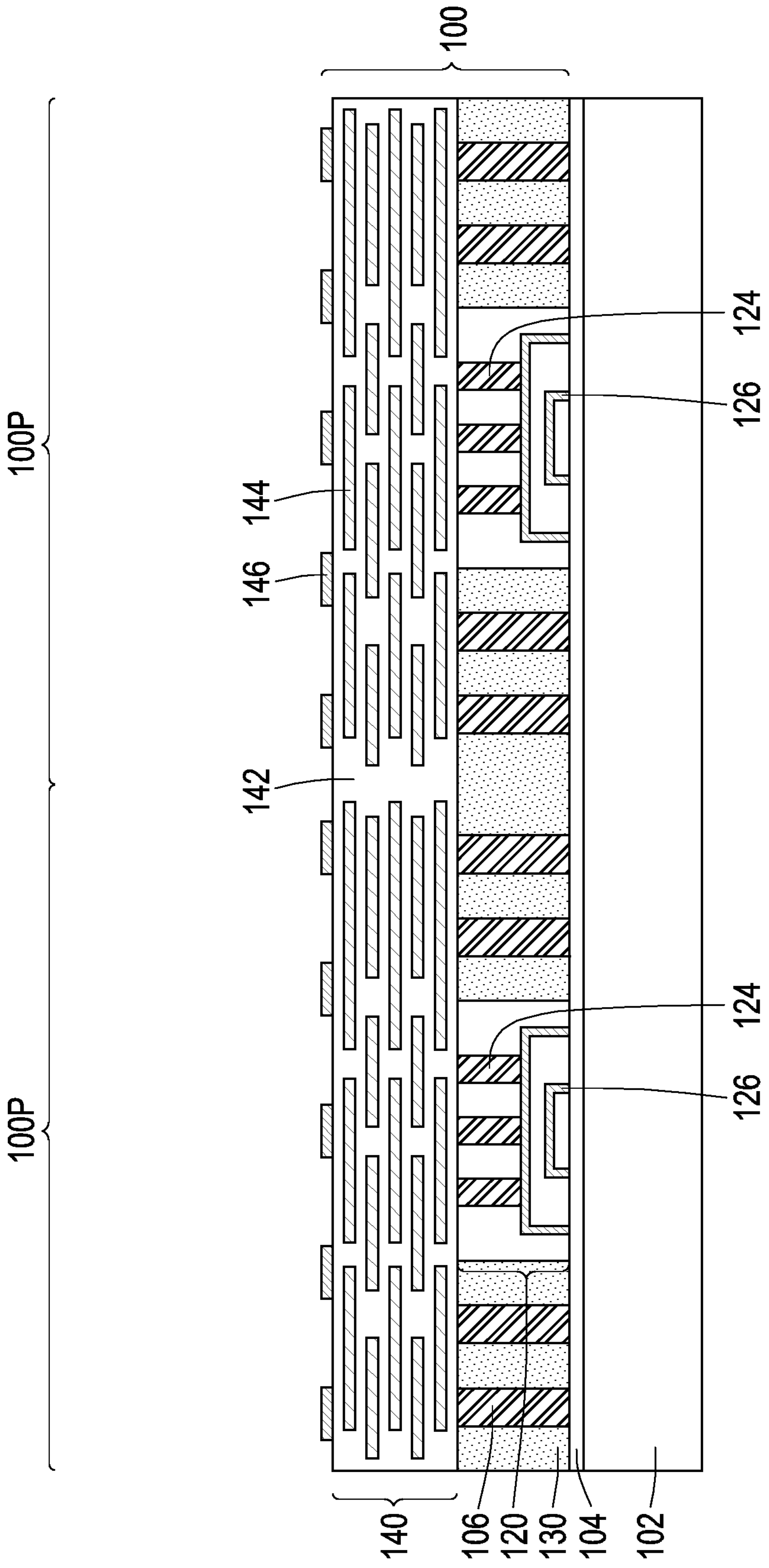

In FIG. 6, a front-side redistribution structure 140 is formed on the top surfaces of the encapsulant 130, the through vias 106, and the interconnection dies 120 (e.g., the substrates 122). The front-side redistribution structure 140 includes dielectric layers 142 and metallization layers 144 (sometimes referred to as redistribution layers or redistribution lines) among the dielectric layers 142. Thus, the front-side redistribution structure 140 includes a plurality of metallization layers 144 separated from each other by respective dielectric layers 142. The metallization layers 144 of the front-side redistribution structure 140 are connected to the through vias 106 and the interconnection dies 120 (e.g., the TSVs 124).

In some embodiments, the dielectric layers 142 are formed of a polymer, which may be a photosensitive material such as PBO, polyimide, a BCB-based polymer, or the like, that may be patterned using a lithography mask. In other embodiments, the dielectric layers 142 are formed of a nitride such as silicon nitride; an oxide such as silicon oxide, PSG, BSG, BPSG; or the like. The dielectric layers 142 may be formed by spin coating, lamination, CVD, the like, or a combination thereof. After each dielectric layer 142 is formed, it is then patterned to expose underlying conductive features, such as portions of the underlying through vias 106, the TSVs 124, and/or the metallization layers 144. The patterning may be by an acceptable process, such as by exposing the dielectrics layers to light when the dielectric layers 142 are a photosensitive material, or by etching using, for example, an anisotropic etch. If the dielectric layers 142 are photosensitive materials, the dielectric layers 142 can be developed after the exposure.

The metallization layers 144 each include conductive vias and/or conductive lines. The conductive vias extend through respective dielectric layers 142, and the conductive lines extend along respective dielectric layers 142. As an example to form a metallization layer 144, a seed layer (not illustrated) is formed over the respective underlying features. For example, the seed layer can be formed on a respective dielectric layer 142 and in the openings through the respective dielectric layer 142. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization layer 144. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by an acceptable etching process, such as by wet or dry etching. The remaining portions of the seed layer and conductive material form the metallization layer 144 for one level of the front-side redistribution structure 140.

The front-side redistribution structure 140 is illustrated as an example. More or fewer dielectric layers 142 and metallization layers 144 than illustrated may be formed by repeating or omitting the steps previously described.

Under-bump metallizations (UBMs) 146 are formed for external connection to the front-side redistribution structure 140. The UBMs 146 have bump portions on and extending along the major surface of the upper dielectric layer 142 of the front-side redistribution structure 140, and have via portions extending through the upper dielectric layer 142 of the front-side redistribution structure 140 to physically and electrically couple the upper metallization layer 144 of the front-side redistribution structure 140. As a result, the UBMs 146 are electrically connected to the through vias 106 and the interconnection dies 120 (e.g., the TSVs 124). The UBMs 146 may be formed of the same material as the metallization layers 144, and may be formed by a similar process as the metallization layers 144. In some embodiments, the UBMs 146 have a different size than the metallization layers 144.

Figure 7:
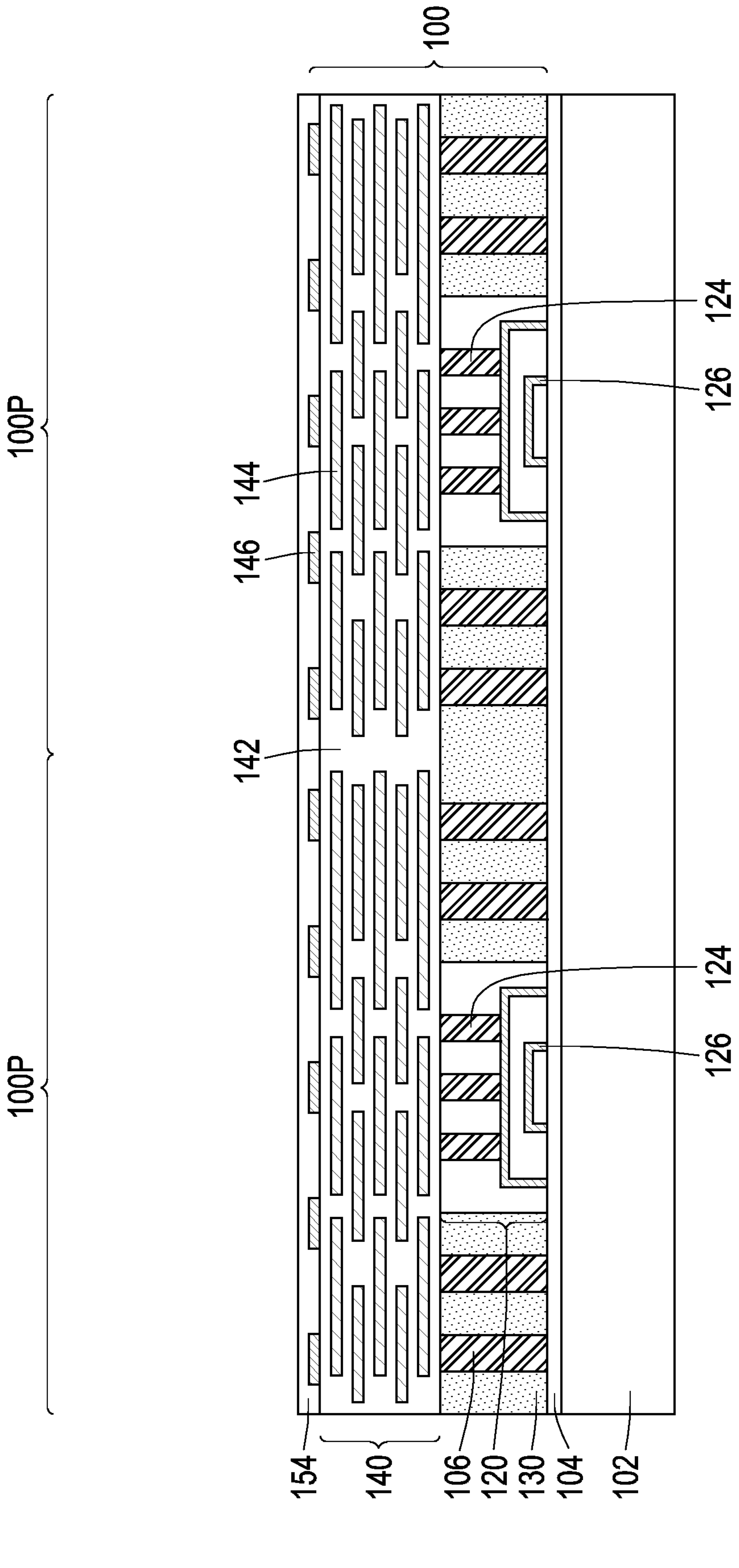

In FIG. 7, a buffer layer 154 is formed on the front-side redistribution structure 140. The buffer layer 154 may be formed of an insulating material such as silicon oxide, silicon nitride, a molding compound, epoxy, or the like. The buffer layer 154 may cover and protect the UBMs 146. A planarization process may optionally be performed on the buffer layer 154, thereby forming a planar surface to which the carrier substrate (not shown, see FIG. 8) may be bonded. The planarization process may be, for example, a CMP, a grinding process, or the like.

Figure 8:
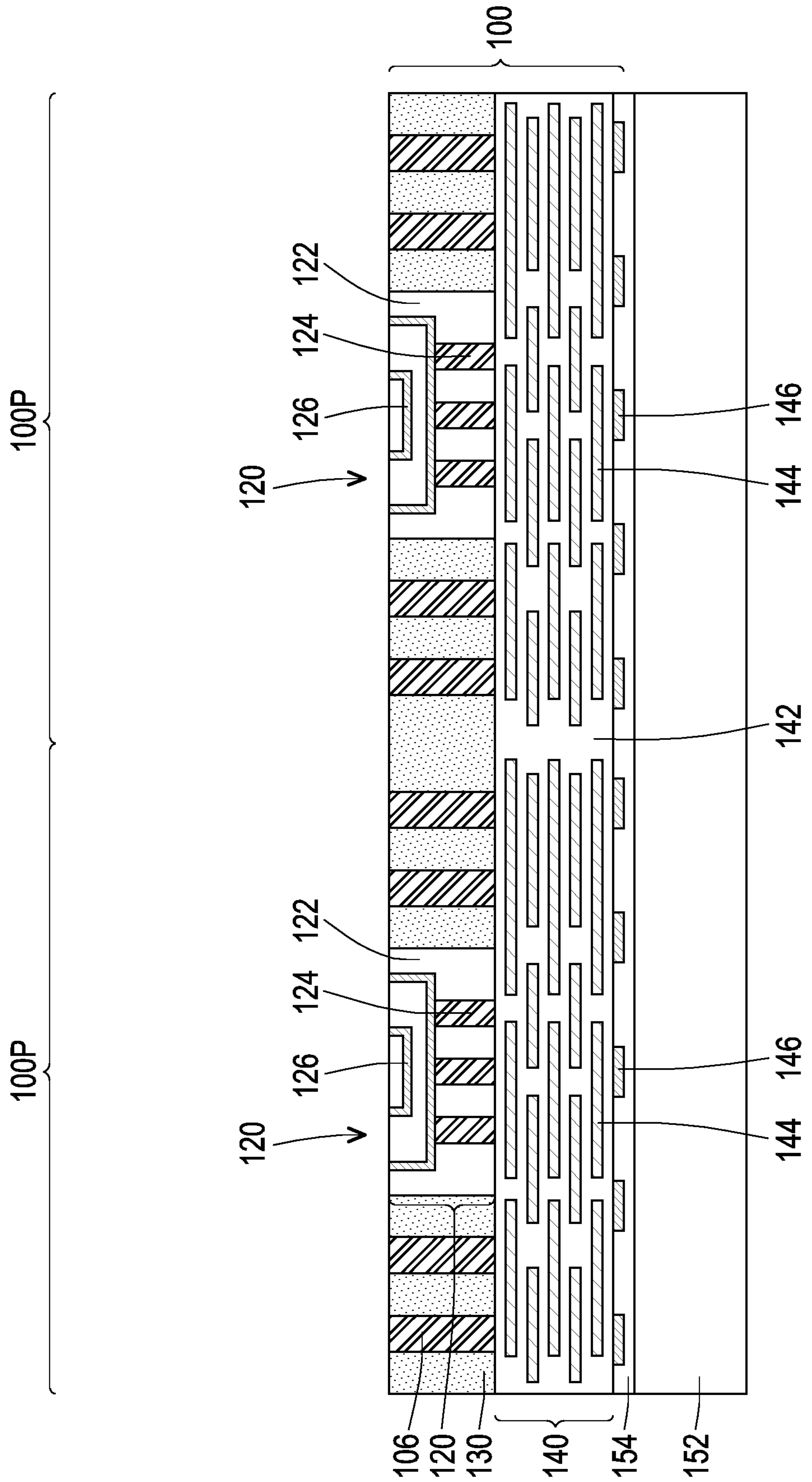

In FIG. 8, a carrier substrate 152 is bonded to the buffer layer 154, and the carrier substrate 102 is detached (or "de-bonded") from the interposer wafer 100. FIG. 8 illustrates the interposer wafer 100 being flipped. In some embodiments, the carrier substrate 152 is a substrate such as a bulk semiconductor or a glass substrate. The carrier substrate 152 may be attached to the front side of the interposer wafer 100. The carrier substrate 152 may be attached by a bonding layer (not separately illustrated), which may be removed along with the carrier substrate 152 from the structure after processing. In some embodiments, the bonding layer includes an oxide layer such as a layer of silicon oxide. In some embodiments, the bonding layer includes an adhesive, such as a suitable epoxy or the like. The detaching of the carrier substrate 102 may include projecting a light such as a laser light or an UV light on the release layer 104 so that the release layer 104 decomposes under the heat of the light and the carrier substrate 102 may be removed.

Figure 9:
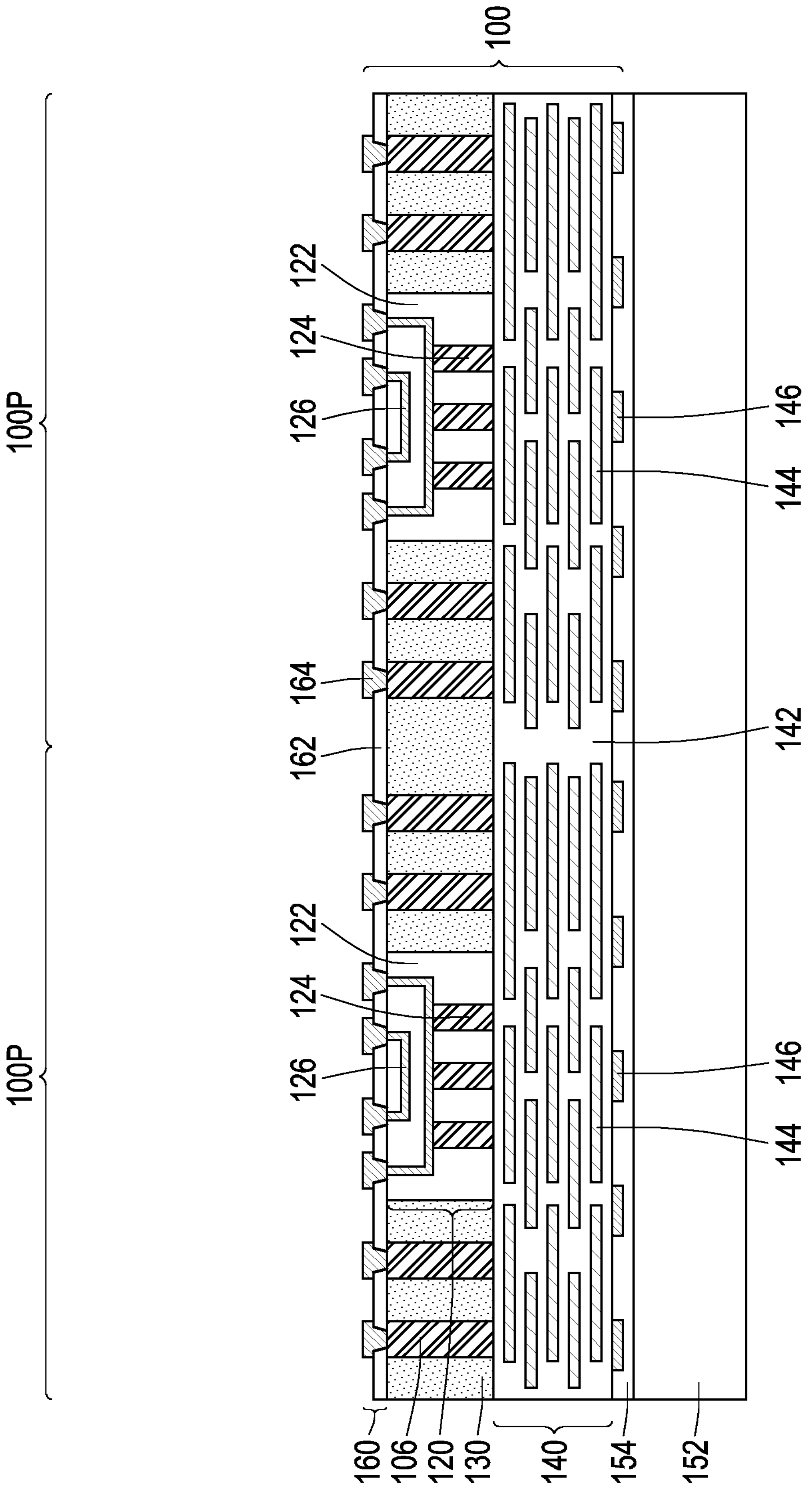

In FIG. 9, a back-side redistribution structure 160 is formed on the bottom surfaces of the encapsulant 130, the through vias 106, and the interconnection dies 120 (e.g., the substrates 122). The back-side redistribution structure 160 includes dielectric layers 162 and metallization layers 164, in a similar manner as the front-side redistribution structure 140. The back-side redistribution structure 160 may be formed by a similar process as the front-side redistribution structure 140.

The metallization layers 164 are connected to the through vias 106 and to the interconnection dies 120 (e.g., the die bridges 126). Additionally, the metallization layers 164 may include die connectors, to which integrated circuit devices will be bonded. The back-side redistribution structure 160 is illustrated as an example. More or fewer dielectric layers 162 and metallization layers 164 than illustrated may be formed in the back-side redistribution structure 160.

Figure 10A:
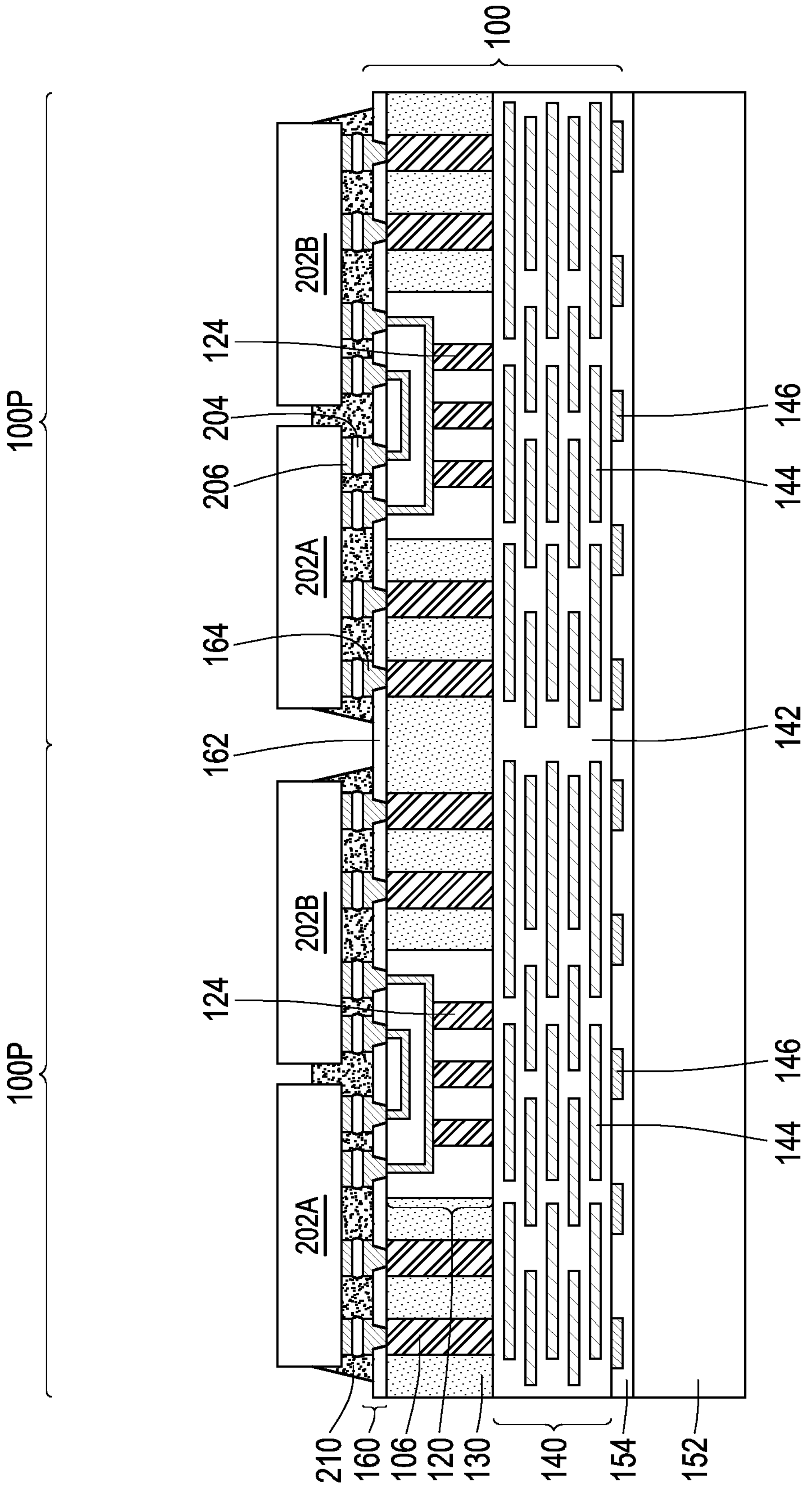
Figure 10B:
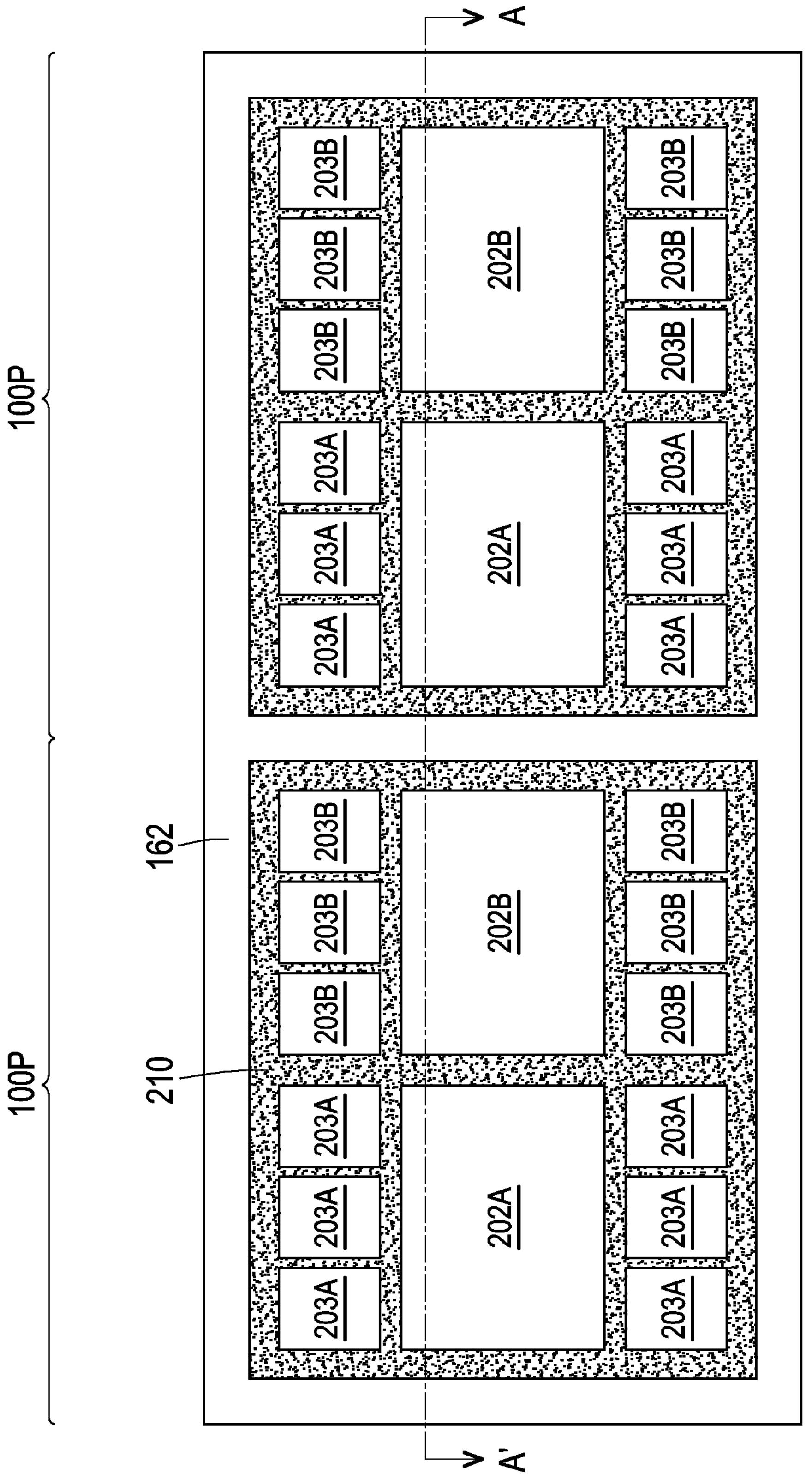

In FIGS. 10A and 10B, integrated circuit devices 202 and 203 are bonded to the back side of the interposer wafer 100 (e.g., to the back-side redistribution structure 160), and an underfill 210 is formed between the integrated circuit devices 202 and 203, and the interposer wafer 100. The cross-sectional view shown in FIG. 10A may be obtained along reference cross-section A-A' of the top-down view shown in FIG. 10B, wherein like reference numerals refer to like features. Multiple integrated circuit devices 202 and 203 are placed adjacent one another in each package region 100P. The layout of integrated circuit devices 202 and 203 illustrated in FIG. 10B is provided as an example, other layouts are contemplated.

In some embodiments, the integrated circuit devices 202 and 203 in each package region 100P include logic devices 202A and 202B as well as memory devices 203A and 203B. Each of the logic device 202A and 202B may be a central processing unit (CPU), graphics processing unit (GPU), system-on-a-chip (SoC) die, microcontroller, system-on-integrated-chip (SoIC) die or the like. The logic devices 202A and 202B may be integrated circuit dies (similar to the integrated circuit die 50 described in FIG. 1) or may be die stacks (similar to the die stack 60A described in FIG. 2A). Each of the memory devices 203A and 203B may be a dynamic random-access memory (DRAM) die, static random access memory (SRAM) die, hybrid memory cube (HMC) module, a high bandwidth memory (HBM) module, or the like. The memory devices 203A and 203B may be integrated circuit dies (similar to the integrated circuit die 50 described in FIG. 1) or may be die stacks (similar to the die stack 60B described in FIG. 2B).

The integrated circuit devices 202 and 203 may be placed on the back-side redistribution structure 160 using, e.g., a pick-and-place tool. The conductive connectors 204 may be formed of a conductive material that is reflowable, such as solder, copper, aluminum, gold, nickel, silver, palladium, tin, the like, or a combination thereof. In some embodiments, the conductive connectors 204 are formed by initially forming a layer of solder through methods such as evaporation, electroplating, printing, solder transfer, ball placement, or the like. Once a layer of solder has been formed on the structure, a reflow may be performed in order to shape the conductive connectors 204 into desired bump shapes. Bonding the integrated circuit devices 202 and 203 to the interposer wafer 100 may include placing the integrated circuit devices 202 and 203 on the interposer wafer 100 and reflowing the conductive connectors 204. Die connectors 206 are at the front sides of the integrated circuit devices 202 and 203. The conductive connectors 204 form joints between the die connectors 206 of the integrated circuit devices 202 and 203 and the die connectors of the back-side redistribution structure 160, thereby electrically connecting the interposers of the interpose wafer 100 to the integrated circuit devices 202 and 203.

The underfill 210 may be formed around the conductive connectors 204 and may encircle the integrated circuit devices 202 and 203 in the top-down view. The underfill 210 may be a continuous material extending from the integrated circuit devices 202 and 203 to the interposer wafer 100. The underfill 210 may also extend on sidewalls of the integrated circuit devices 202 and 203. The underfill 210 may reduce stress and protect the joints resulting from the reflowing of the conductive connectors 204. The underfill 210 may be formed of an underfill material such as a molding compound, epoxy, or the like. The underfill 210 may be formed by a capillary flow process after the integrated circuit devices 202 and 203 are bonded to the interposer wafer 100, or may be formed by a suitable deposition method before the integrated circuit devices 202 and 203 are bonded to the interposer wafer 100. The underfill 210 may be applied in liquid or semi-liquid form and then subsequently cured.

Figure 11:
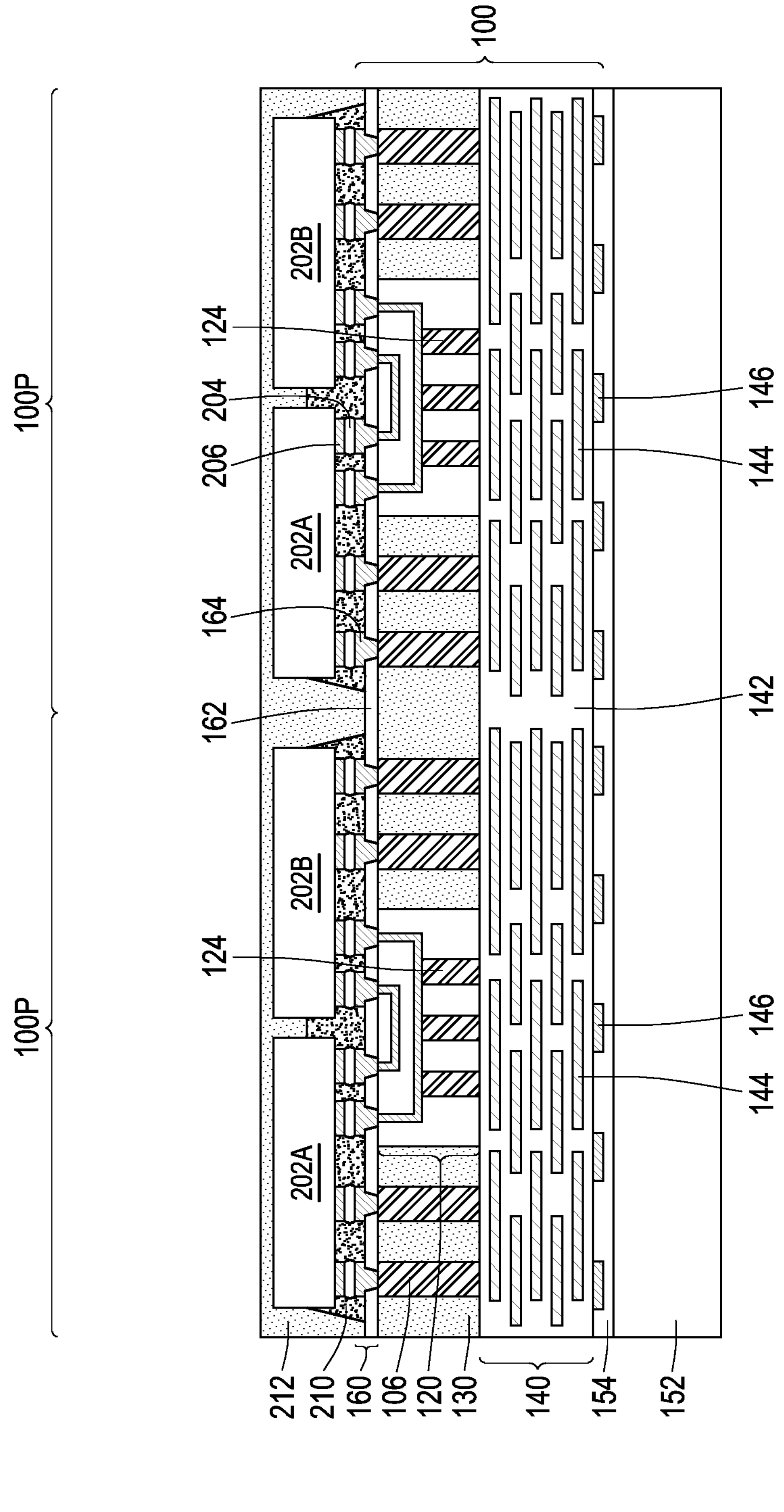

In FIG. 11, an encapsulant 212 is formed on and around the various components. After formation, the encapsulant 212 encapsulates the underfill 210 and the integrated circuit devices 202 and 203. The encapsulant 212 may be a molding compound, epoxy, or the like. The encapsulant 212 may be applied by compression molding, transfer molding, or the like, and is formed over the interposer wafer 100 such that the integrated circuit devices 202 and 203 are buried or covered. The encapsulant 212 may be applied in liquid or semi-liquid form and then subsequently cured.

Optionally, the encapsulant 212 may be thinned (not separately illustrated) to expose the integrated circuit devices 202 and 203. The thinning process may be a grinding process, a CMP, an etch-back, combinations thereof, or the like. After the thinning process, the top surfaces of the integrated circuit devices 202 and 203, and the encapsulant 212 are substantially coplanar (within process variations). The thinning is performed until a desired amount of the integrated circuit devices 202 and 203, and the encapsulant 212 has been removed.

Figure 12:
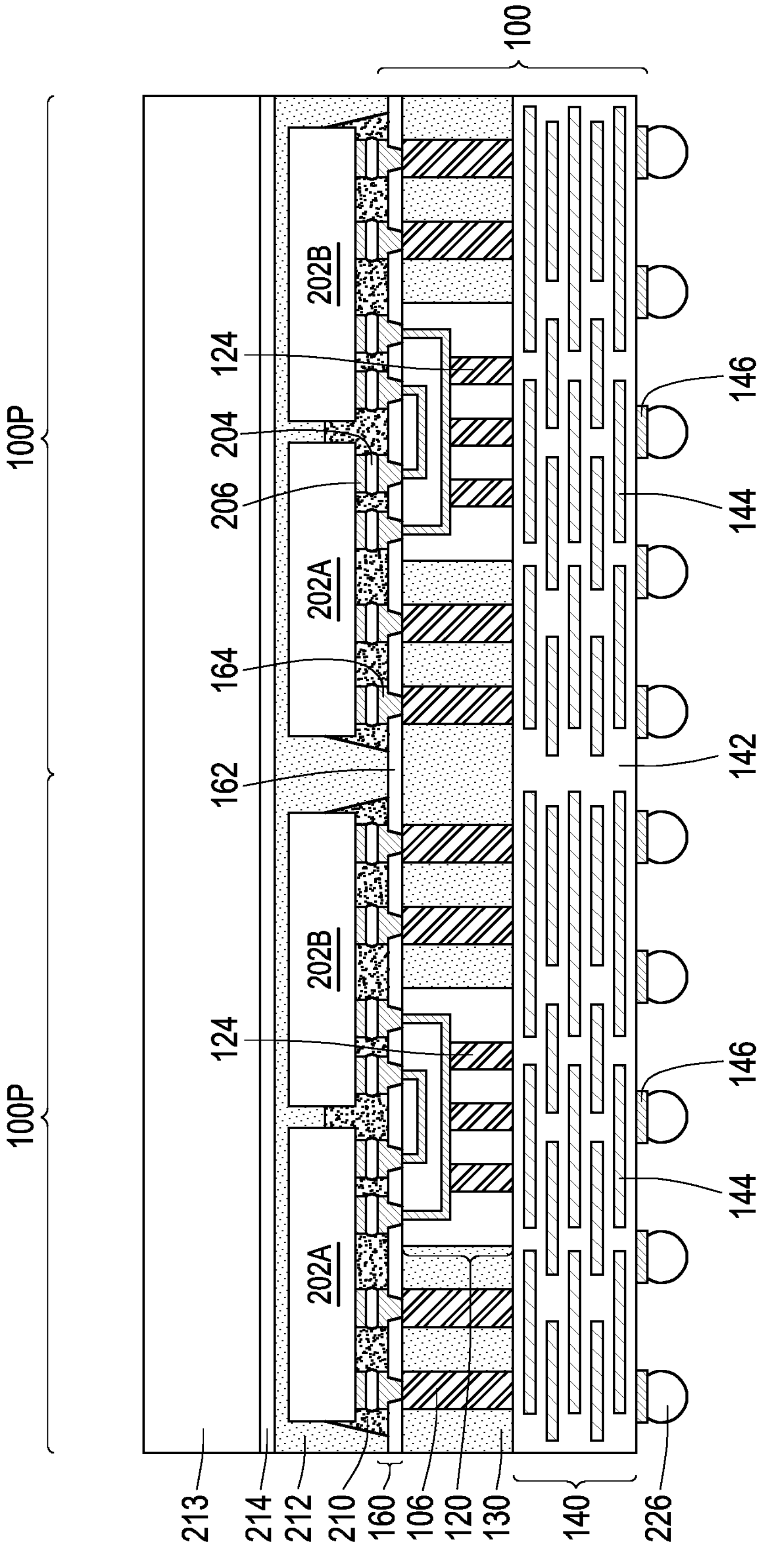

In FIG. 12, a carrier swap is performed, the buffer layer 154 is removed to expose the UBMs 146, and conductive connectors 226 are formed on the UBMs 146. During the carrier swap, a carrier 213 may be attached to the encapsulant 212 and the carrier substrate 152 may be removed from the front-side redistribution structure 140. The carrier 213 may be same or similar to the carrier substrate 102. The carrier 213 may be attached to the encapsulant 212 by a release layer 214, which may be same or similar to the release layer 104. The carrier substrate 152 may be removed by a grinding process or the like. The buffer layer 154 may be removed by a suitable etching process or the like. The conductive connectors 226 may be formed of a same or similar material and by same or similar method as the conductive connectors 204.

Figure 13:
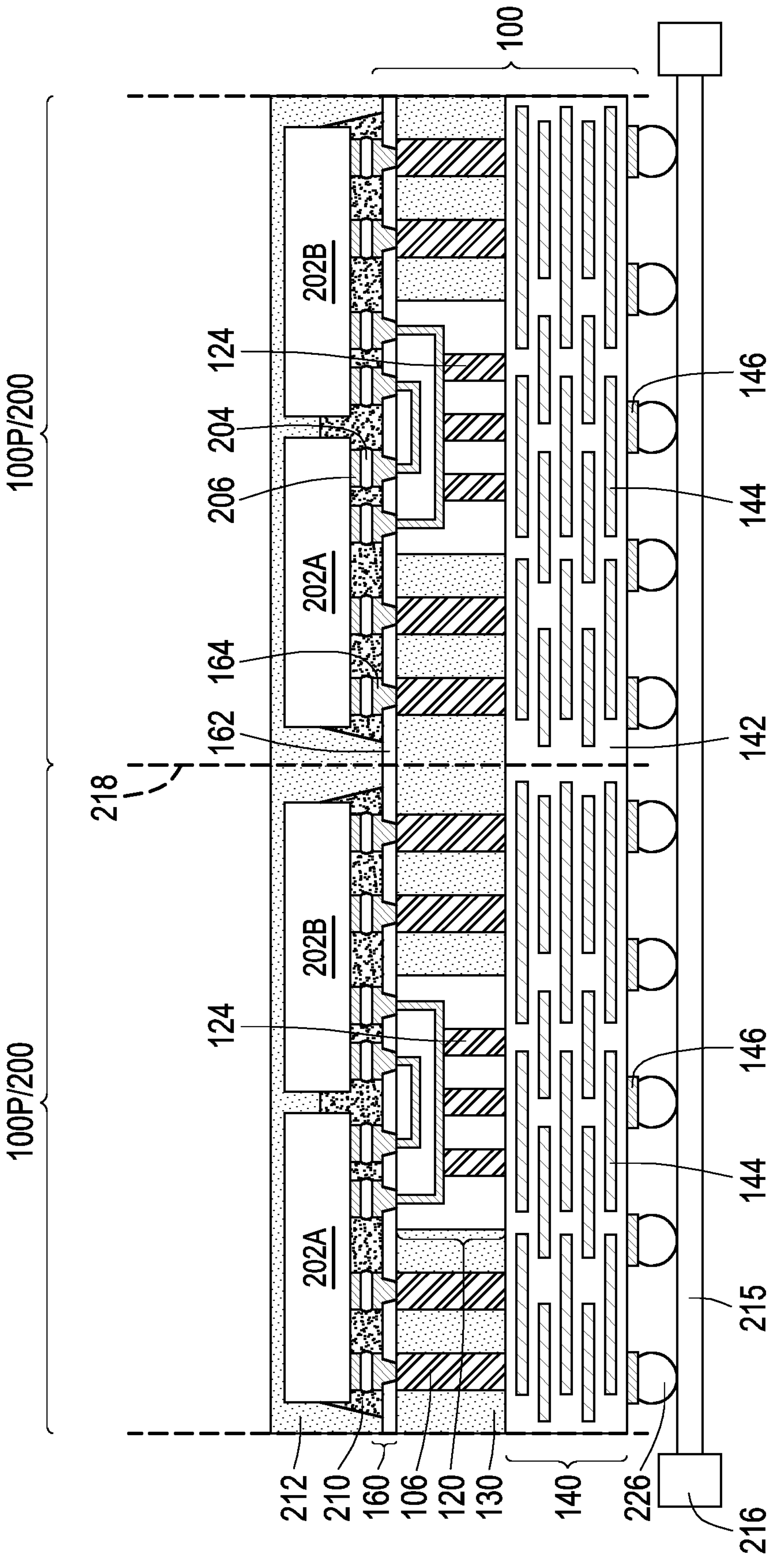

In FIG. 13, the carrier 213 is removed and the structure is placed on a tape 215 supported by a frame 216, and the structure on the tape 215 is singulated. The removal of the carrier 213 may be same or similar to the removal of the carrier substrate 102. The structure on the tape 215 may be singulated by sawing, dicing, or the like. The singulation process may be performed along scribed lines 218 between the package regions 100P to produce individual integrated circuit package components 200. Each package region 100P may correspond to one integrated circuit package component 200. The singulation process may also form an interposer 229 (see FIG. 14A) in each integrated circuit package component 200 by dividing the interposer wafer 100. As a result of the singulation process, the outer sidewalls of an interposer 229 and the encapsulant 212 are laterally coterminous (within process variations).

Figure 14A:
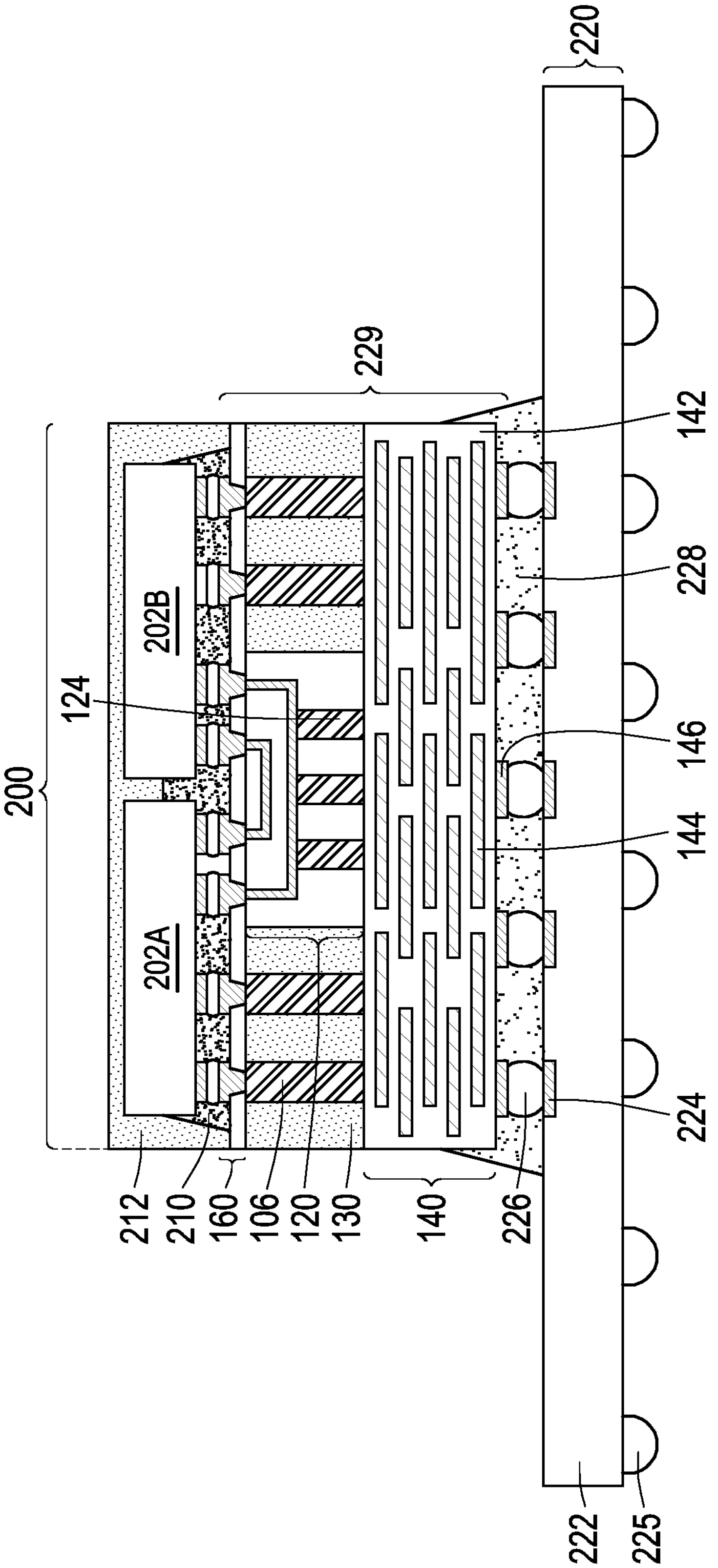
Figure 14B:
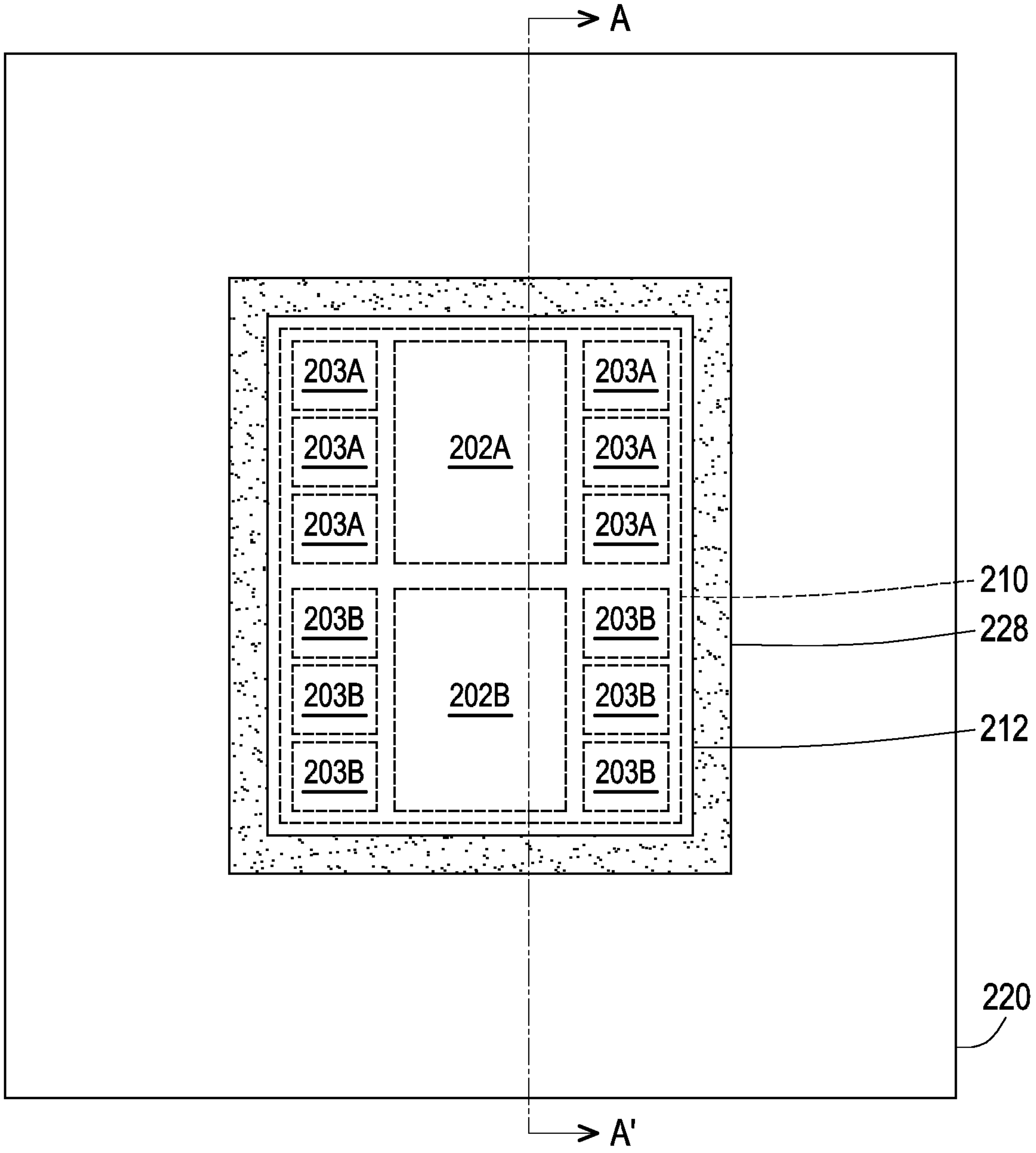

In FIGS. 14A and 14B, the integrated circuit package component 200 is bonded to a package substrate 220 and an underfill 228 is formed between the integrated circuit package component 200 and the package substrate 220. The cross-sectional view shown in FIG. 14A may be obtained along reference cross-section A-A' of the top-down view shown in FIG. 14B, wherein like reference numerals refer to like features. The integrated circuit devices 202 and 203, and the underfill 210 are shown in dashed lines in FIG. 14B for illustrative purposes. The package substrate 220 may include a substrate base 222, which may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate base 222 may be a SOI substrate. Generally, an SOI substrate includes a layer of a semiconductor material such as epitaxial silicon, germanium, silicon germanium, SOI, SGOI, or combinations thereof. The substrate base 222 is, in some embodiments, an insulating core such as a fiberglass reinforced resin core. One example core material is fiberglass resin such as FR4. Other examples for the core material include bismaleimide-triazine (BT) resin, or alternatively, other printed circuit board (PCB) materials or films. Build up films such as Ajinomoto build-up film (ABF) or other laminates may be used for the substrate base 222.

The package substrate 220 may also include active and passive devices (not separately illustrated). Devices such as transistors, capacitors, resistors, combinations thereof, and the like may be used to generate the structural and functional requirements of the design for the system. The devices may be formed using any suitable methods. In some embodiments, the package substrate 220 is substantially free of active and passive devices. The package substrate 220 may further include metallization layers (not separately illustrated), vias (not separately illustrated), and bond pads 224 over the metallization layers and vias. The metallization layers may be over the active and passive devices and are designed to connect the various devices to form functional circuitry. The metallization layers may be formed of alternating layers of dielectric material (e.g., low-k dielectric material) and conductive material (e.g., copper), with vias interconnecting the layers of conductive material, and may be formed through any suitable process (such as deposition, damascene, or the like). The bond pads 224 may on a surface of the package substrate 220 and may be connected to the conductive connectors 226 when the integrated circuit package component 200 is bonded to the package substrate 220. As a result, the integrated circuit package component 200 may be electrically connected to the package substrate 220 by the conductive connectors 226. The package substrate 220 may further include conductive connectors 225. The conductive connectors 225 may be electrically connected to the conductive elements of the package substrate 220 and may be connected to external devices (not separately illustrated).

The underfill 228 may be formed around the conductive connectors 226 and may encircle the integrated circuit package component 200 in the top-down view. The underfill 228 may be a continuous material extending from the integrated circuit package component 200 to the package substrate 220. The underfill 228 may also extend on sidewalls of the integrated circuit package component 200. The underfill 228 may reduce stress and protect the joints resulting from the reflowing of the conductive connectors 226. The underfill 228 may be formed of a same or similar material and by same or similar method as the underfill 210.

Figure 15A:
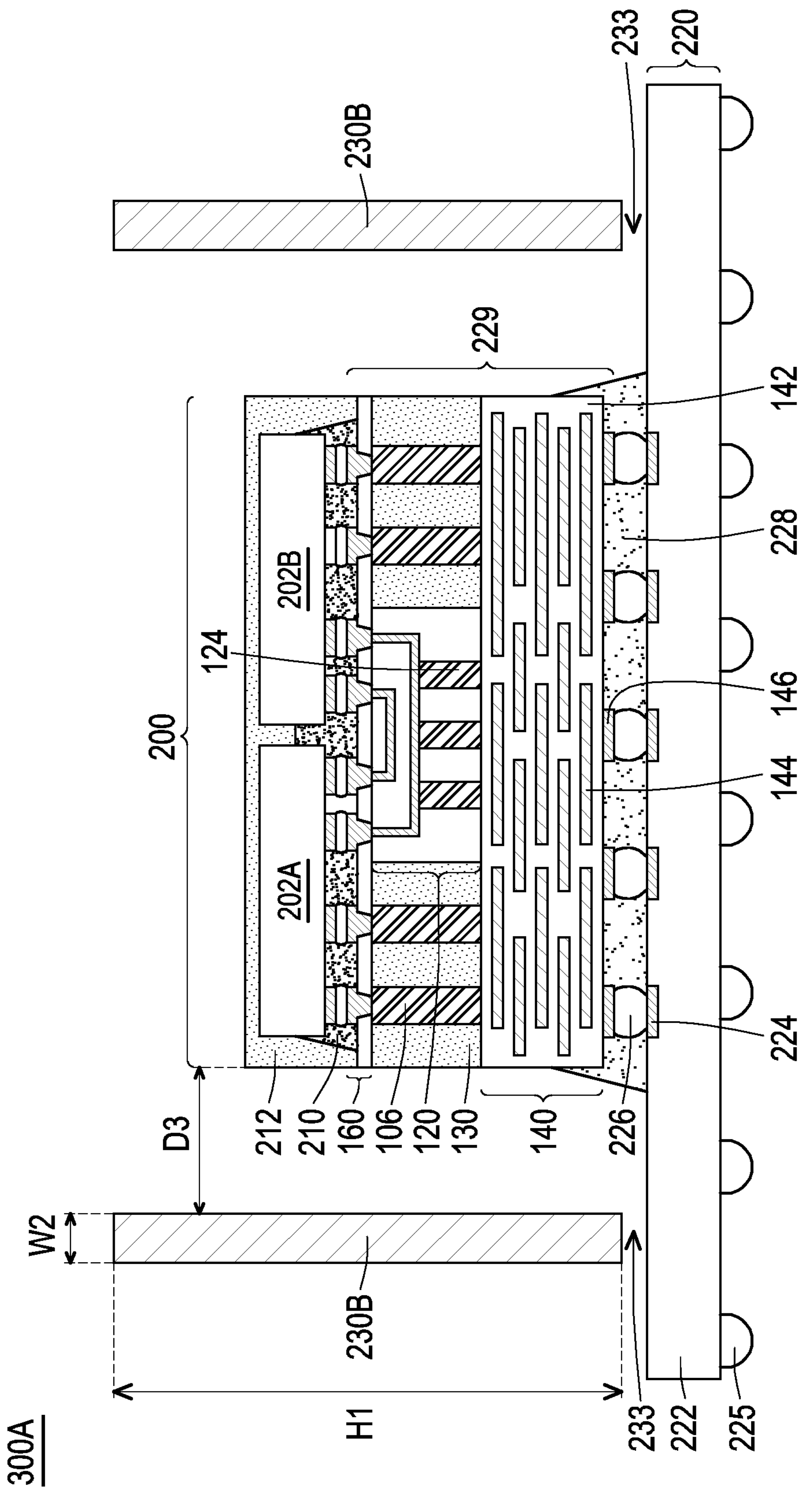
Figure 15B:
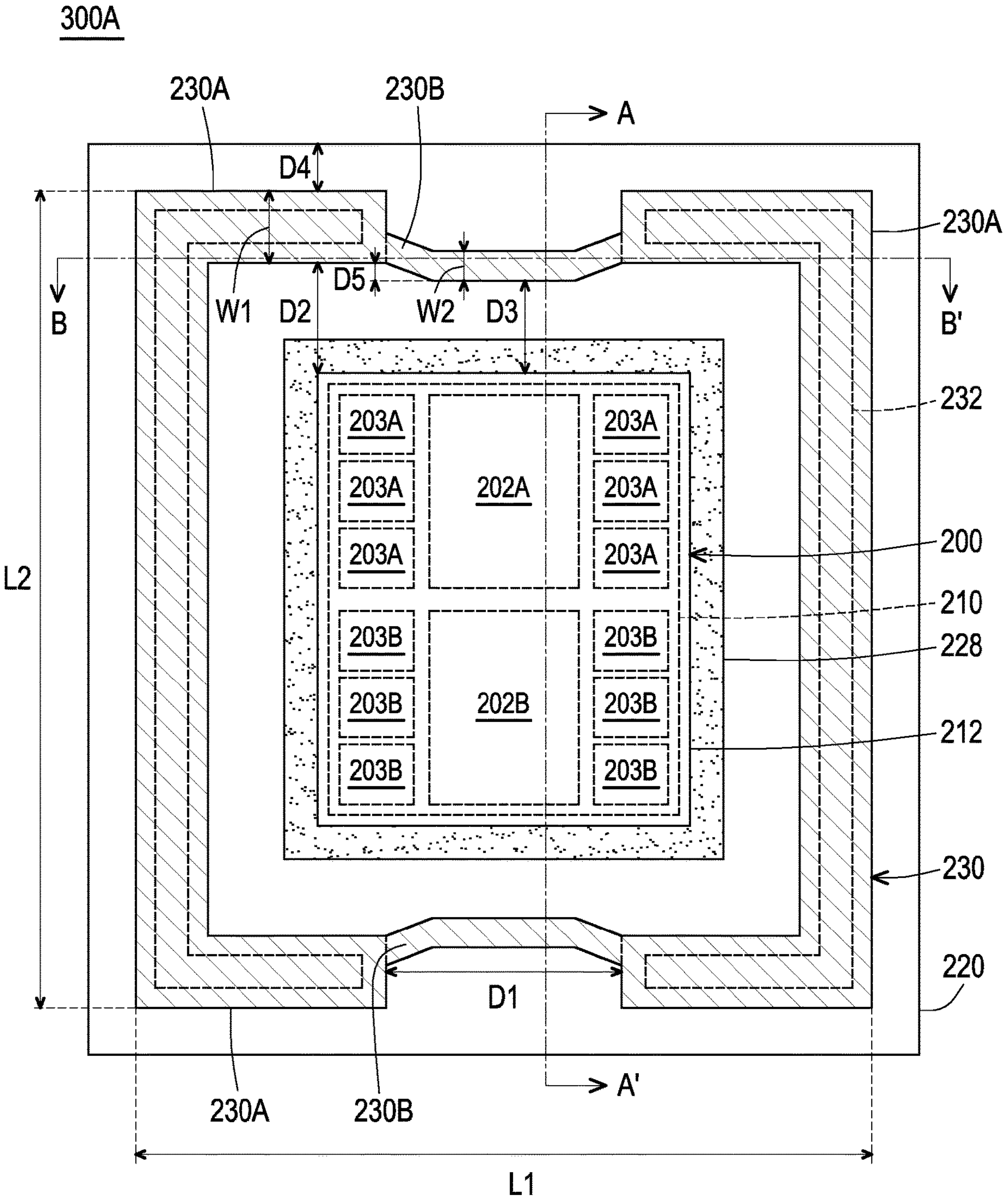
Figure 15C:
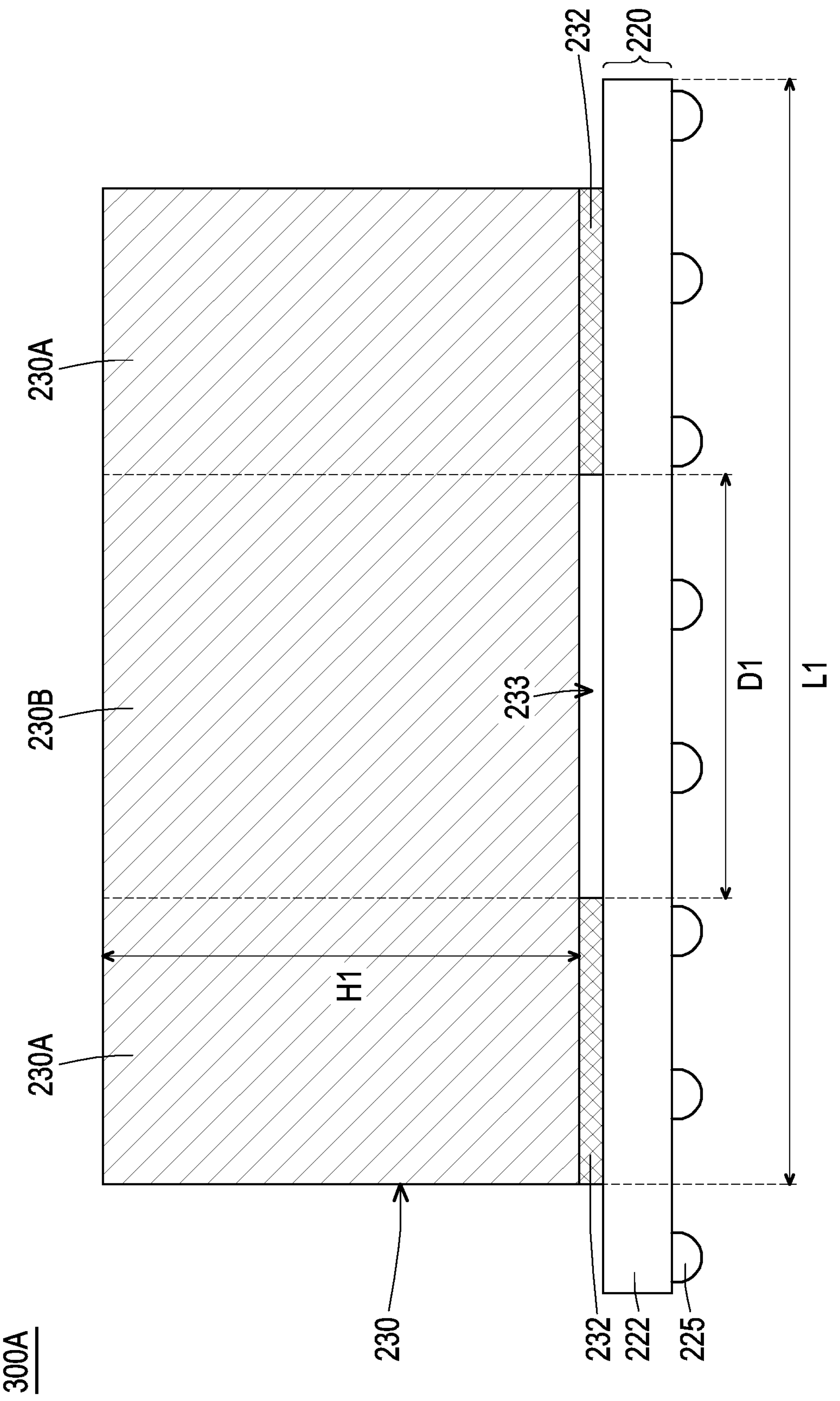

In FIGS. 15A, 15B, and 15C, a stiffener ring 230 is attached to the package substrate 220 by an adhesive 232. The stiffener ring 230 may be referred to as a ring structure. The stiffener ring 230 may reduce the warpage of the package substrate 220 without inducing detrimental stress in the underfill 210 in the integrated circuit package component 200 and the underfill 228. The cross-sectional view shown in FIGS. 15A and 15C may be obtained along reference cross-sections A-A' and B-B' of the top-down view shown in FIG. 15B, respectively, wherein like reference numerals refer to like features. The integrated circuit devices 202 and 203, the underfill 210, and the adhesive 232 are shown in dashed lines in FIG. 15B for illustrative purposes. The structure shown in FIGS. 15A, 15B, and 15C may be referred to as the integrated circuit package 300A.

The stiffener ring 230 may comprise attached segments 230A and suspended segments 230B. The attached segments 230A and the suspended segments 230B are separated by dashed lines in FIGS. 15B and 15C for illustrative purposes. The suspended segments 230B and the attached segments 230A may be a same piece of continuous material. The attached segments 230A may be attached to the package substrate 220 by the adhesive 232 (see FIG. 15C), wherein bottom surfaces of the attached segments 230A may be covered by the adhesive 232 and the adhesive 232 may physically contact and extend between the attached segments 230A and the package substrate 220. FIG. 15B shows the adhesive 232 partially covered the bottom surfaces of the attached segments 230A for illustrative purposes. The bottom surfaces of the attached segments 230A may be completely covered by the adhesive 232 as shown in FIG. 15C. The suspended segments 230B may be suspended over the package substrate 220, wherein bottom surfaces of the suspended segments 230B as well as cavities 233 between the suspended segments 230B and the package substrate 220 are free of the adhesive 232. As a result, the integrated circuit package component 200 and the package substrate 220 may have more freedom of movement when heated during operation and, the stress in the underfill 210 and the underfill 228 induced by a coefficient of thermal expansion (CTE) mismatch between the stiffener ring 230 and the package substrate 220 may be reduced. Therefore, the delamination of the underfill 210 from the integrated circuit devices 202 and 203, the cracking in the underfill 210, the delamination of the underfill 228 from the integrated circuit package component 200, and/or the cracking in the underfill 228 may be prevented or reduced.

The stiffener ring 230 may comprise a material of a high hardness, such copper, stainless steel (e.g., SUS430), Alloy 42, or the like. In some embodiments, the stiffener ring 230 has a higher CTE than the package substrate 220. In some embodiments, the stiffener ring 230 has a lower CTE than the package substrate 220. The adhesive 232 may be such as an epoxy, glue, thermally conductive adhesive (e.g., SE4450), or the like. The adhesive 232 may be applied in liquid or semi-liquid form and then subsequently cured.

The stiffener ring 230 may encircle the integrated circuit package component 200 in the top-down view. In the embodiment illustrated in FIG. 15B, the stiffener ring 230 may comprise two attached segments 230A interconnected the by the suspended segments 230B. The suspended segments 230B may extend along the opposite edges of the package substrate 220. Each of the attached segments 230A may be in a shape of a bracket, and each of the suspended segments 230B may be in a shape of a bow. The suspended segments 230B may protrude towards the integrated circuit package component 200 from inner sidewalls of the attached segments 230A. In some embodiments, longitudinal axes of the suspended segments 230B are substantially perpendicular to interfaces between the logic devices 202A and the memory devices 203A and/or interfaces between the logic devices 202B and the memory devices 203B in the integrated circuit package component 200. In some embodiments, the suspended segments 230B are at other locations between the attached segments 230A relative to the inner sidewalls of the attached segments 230A.

The stiffener ring 230 may have a length L1 along the longitudinal axes of the suspended segments 230B. The length L1 may be in a range of about 50 mm to about 150 mm. The length L1 may be a length of a portion of the stiffener ring 230 that comprises one suspended segment 230B and a part of each of the two attached segments 230A as illustrated in FIG. 15B. The stiffener ring 230 may have a length L2 perpendicular to the longitudinal axes of the suspended segments 230B. The length L2 may be in a range of about 50 mm to about 150 mm. The length L1 and the length L2 may be same or different. The two attached segments 230A may be spaced apart by a distance D1, which may correspond to a longitudinal length of the suspended segment 230B. The distance D1 may also correspond to a length of the cavities 233 (see FIG. 15C). A ratio R1 of the distance D1 to the length L1 may be in a range of about 20% to about 60%. When the ratio R1 is in the range of about 20% to about 60%, the stiffener ring 230 may be sufficiently attached to the package substrate 220 by the adhesive 232, and the stress in the underfill 210 and the underfill 228 induced by the CTE mismatch between the stiffener ring 230 and the package substrate 220 may be sufficiently reduced to prevent or reduce delamination. The attached segments 230A may have a width W1. A ratio R2 of the width W1 to the length L1 may be in a range of about 6% to about 20%. The suspended segments 230B may have a width W2. A ratio R3 of the width W2 to the width W1 may be in a range of about 50% to about 100%. In some embodiments, the width W2 is smaller than the width W1.

The attached segments 230A may be spaced apart from the integrated circuit package component 200 by a distance D2. A ratio R3 of the distance D2 to the length L1 may be in a range of about 5% to about 15%. The suspended segments 230B may be spaced apart from the integrated circuit package component 200 by a distance D3. A ratio R4 of the distance D3 to the length L1 may be in a range of about 3% to about 12%. In some embodiments, the distance D3 is smaller than the distance D2. An inner sidewall of the suspended segment 230B closest to the integrated circuit package component 200 may be spaced apart from the inner sidewall of the attached segment 230A by a distance D5, which may be referred to as the bending distance of the suspended segment 230B. The distance D5 may be larger than 0 and smaller than about 12% of the length L1. The attached segments 230A may be spaced apart from the corresponding edges of the package substrate 220 by a distance D4 in a range of about 0.5 mm to about 10% of the length L1. The stiffener ring 230, including the attached segments 230A and the suspended segments 230B, may have a height H1 in a range of about 2 mm to about 6 mm.

The height H1 may refer to a distance between a top surface of the stiffener ring 230 and a bottom surface of the stiffener ring 230.

Figure 15D:
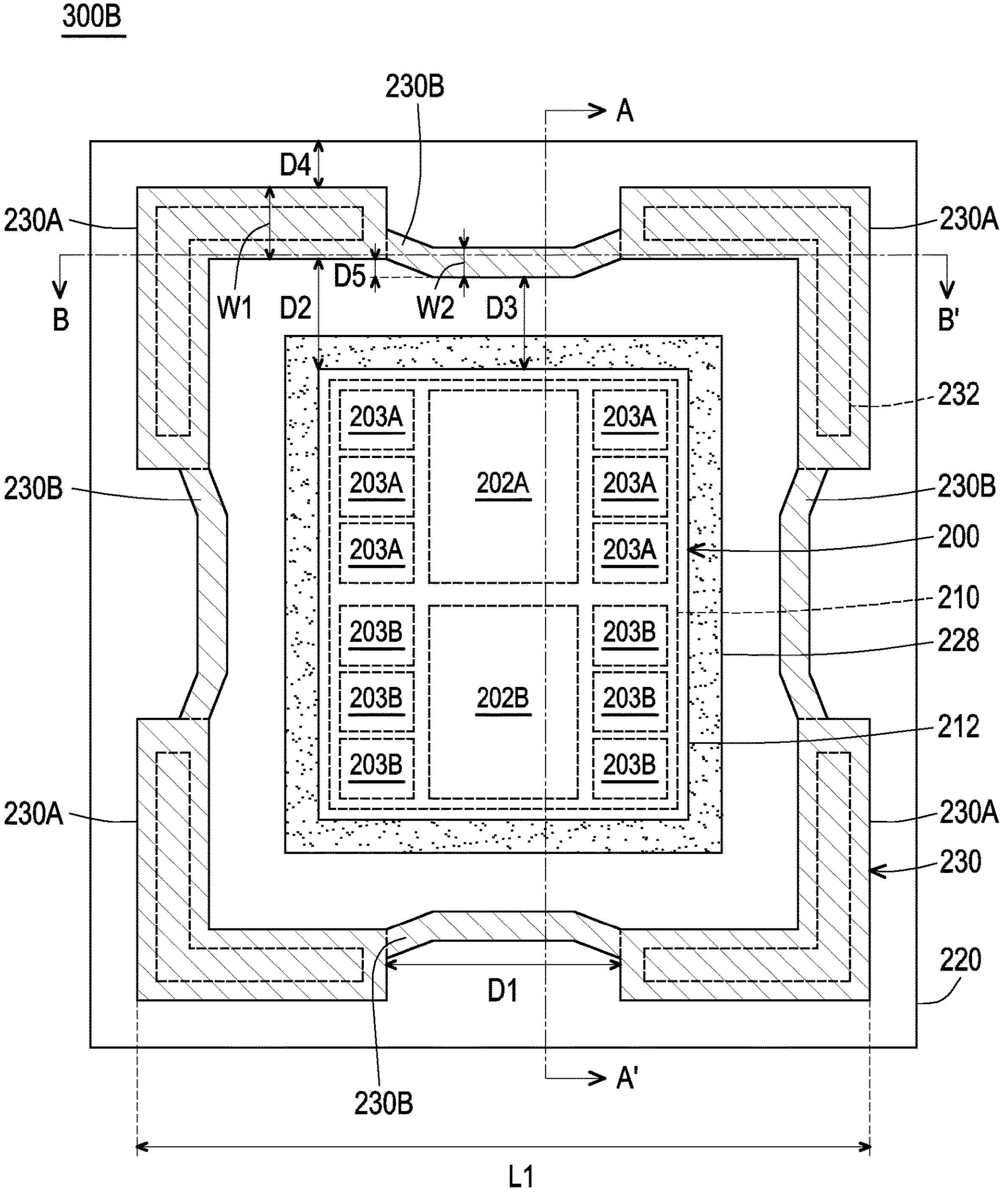

FIG. 15D shows an integrated circuit package 300B in accordance with some embodiments. The integrated circuit package 300B has a similar structure to the integrated circuit package 300A shown in FIGS. 15A, 15B, and 15C, wherein like reference numerals refer to like features. In the embodiment illustrated in FIG. 15D, the stiffener ring 230 in the integrated circuit package 300B may comprise four attached segments 230A interconnected by the suspended segments 230B. The attached segments 230A may be disposed at the corners of the package substrate 220. The suspended segments 230B may extend along the edges of the package substrate 220. Each of the attached segments 230A may be in a shape of an "L" and each of the suspended segments 230B may be in a shape of a bow. The suspended segments 230B may protrude towards the integrated circuit package component 200 from the inner sidewalls of the attached segments 230A.

Figure 16A:
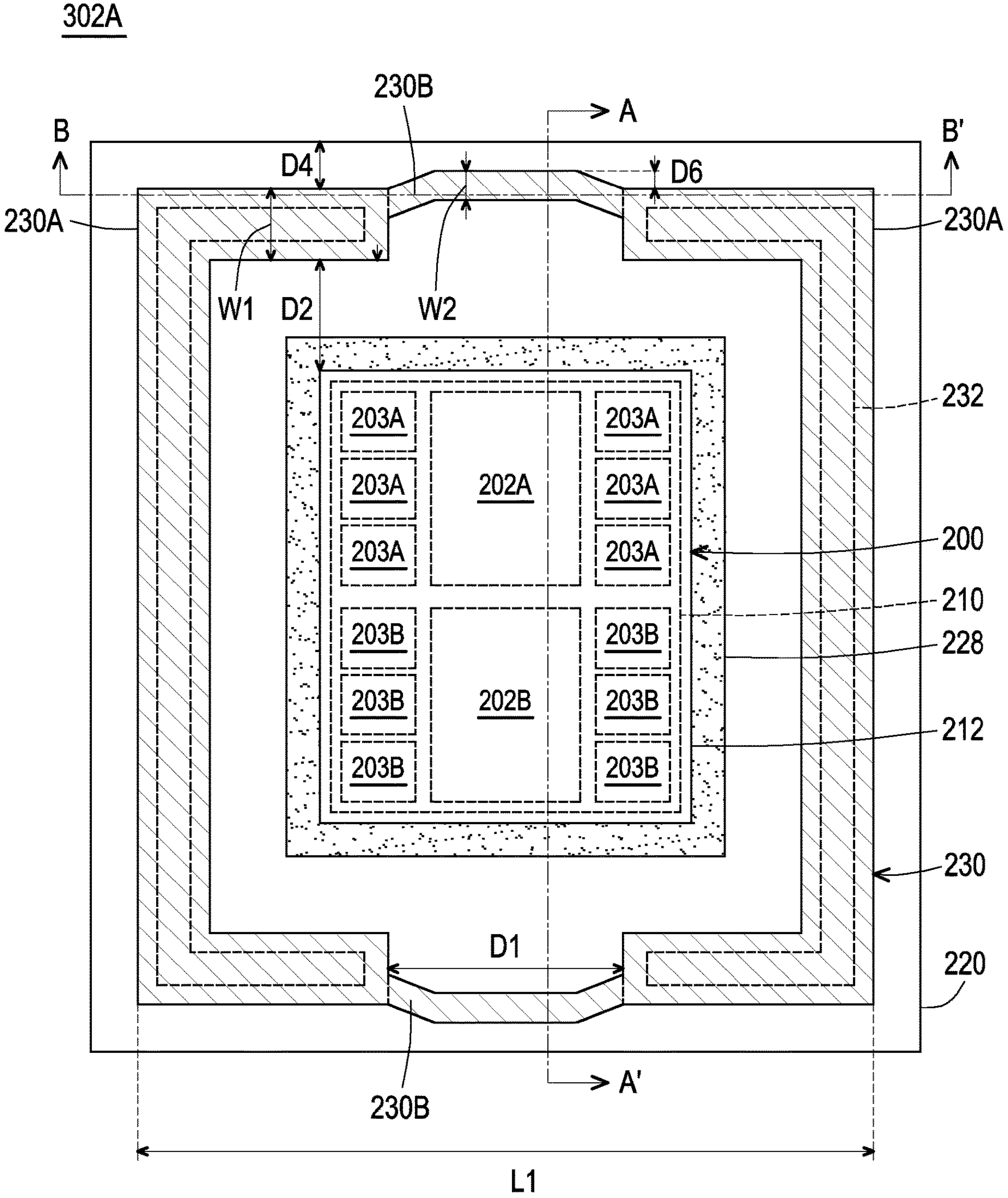

FIG. 16A shows an integrated circuit package 302A in accordance with some embodiments. The integrated circuit package 302A has a similar structure to the integrated circuit package 300A shown in FIGS. 15A, 15B, and 15C, wherein like reference numerals refer to like features. In the embodiment illustrated in FIG. 16A, the stiffener ring 230 may comprise two attached segments 230A interconnected by the suspended segments 230B. The suspended segments 230B may extend along the opposite edges of the package substrate 220. Each of the attached segments 230A may be in a shape of a bracket, and each of the suspended segments 230B may be in a shape of a bow. The suspended segments 230B in the integrated circuit package 302A may protrude away from the integrated circuit package component 200 from outer sidewalls of the attached segments 230A. In some embodiments, the suspended segments 230B are at other locations between the attached segments 230A relative to the outer sidewalls of the attached segments 230A. An outer sidewall of the suspended segment 230B closest to the edge of the package substrate 220 may be spaced apart from the outer sidewall of the attached segment 230A by a distance D6, which may be referred to as the bending distance of the suspended segment 230B. The distance D6 may be larger than 0 and smaller than about 12% of the length L1.

Figure 16B:
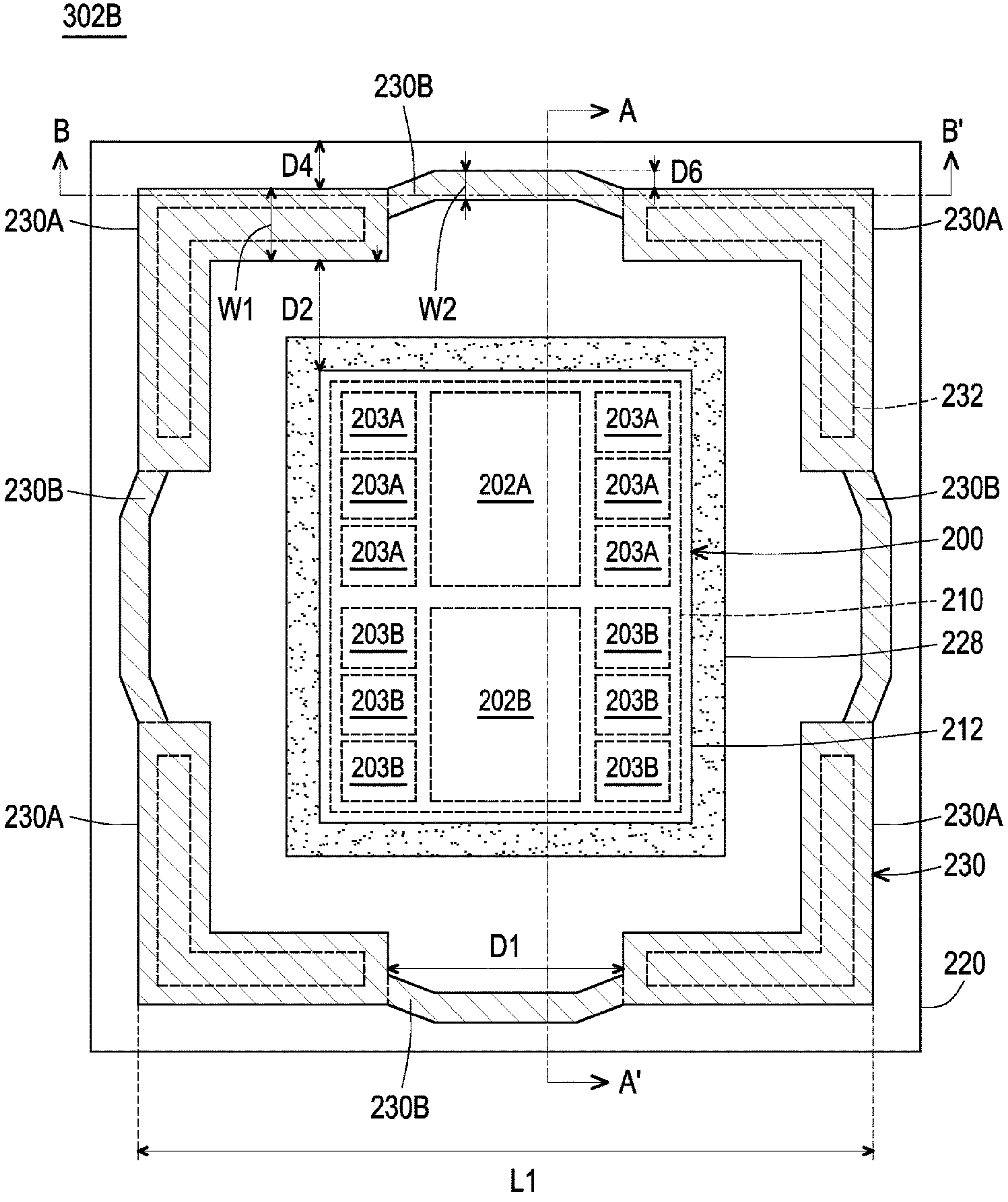

FIG. 16B shows an integrated circuit package 302B in accordance with some embodiments. The integrated circuit package 302B has a similar structure to the integrated circuit package 302A shown in FIG. 16A, wherein like reference numerals refer to like features. In the embodiment illustrated in FIG. 16B, the stiffener ring 230 in the integrated circuit package 300B may comprise four attached segments 230A interconnected by the suspended segments 230B. The attached segments 230A may be disposed at the corners of the package substrate 220. The suspended segments 230B may extend along the edges of the package substrate 220. Each of the attached segments 230A may be in a shape of an "L" and each of the suspended segments 230B may be in a shape of a bow. The suspended segments 230B may protrude away from the integrated circuit package component 200 from the outer sidewalls of the attached segments 230A.

Figure 17A:
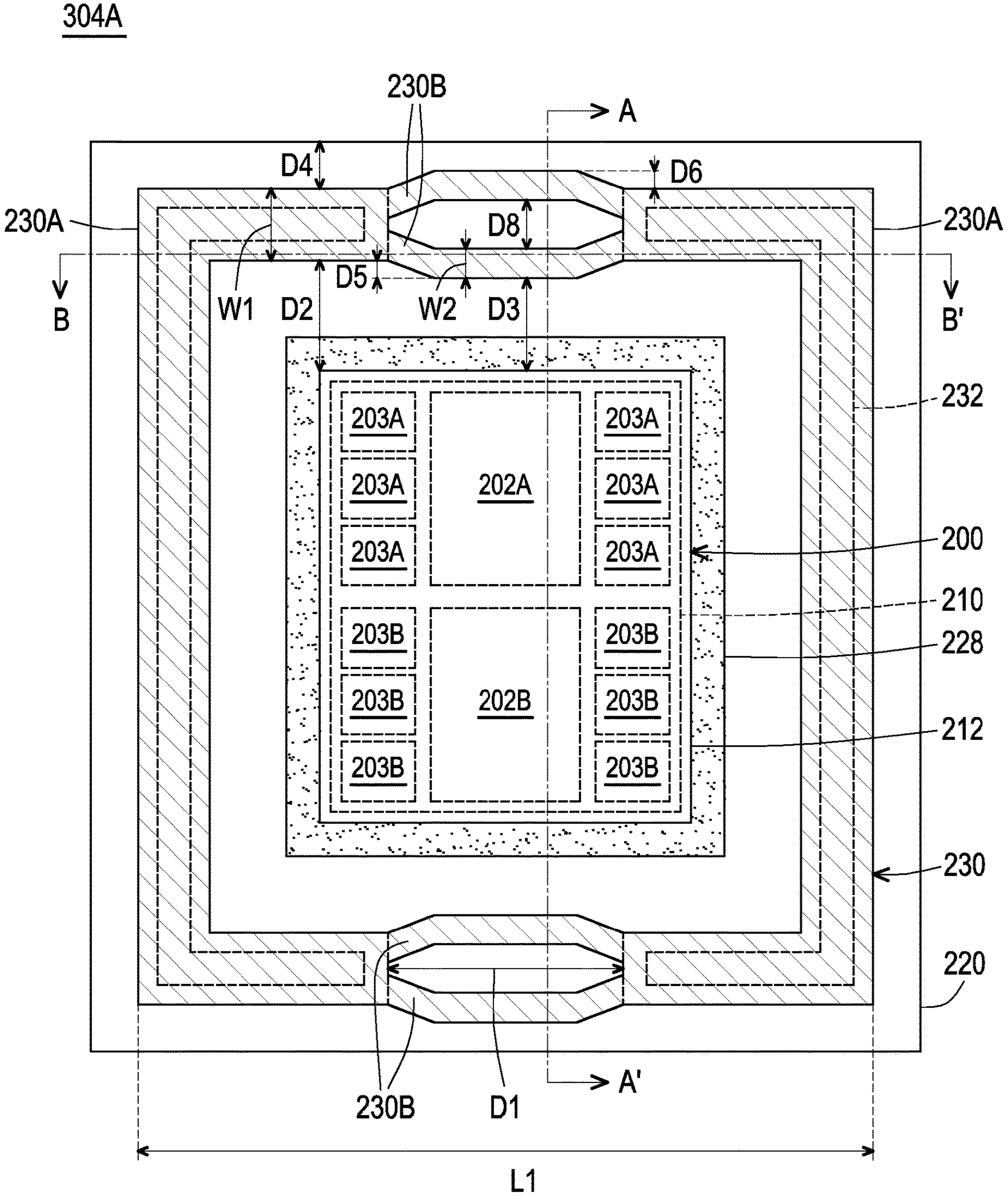

FIG. 17A shows an integrated circuit package 304A in accordance with some embodiments. The integrated circuit package 304A has a similar structure to the integrated circuit packages 300A and 302A shown in FIGS. 15A, 15B, 15C, and 16A, wherein like reference numerals refer to like features. In the embodiment illustrated in FIG. 17A, the stiffener ring 230 may comprise two attached segments 230A interconnected by the suspended segments 230B that protrude toward and away from the integrated circuit package component 200. The suspended segments 230B may extend along the opposite edges of the package substrate 220. Each of the attached segments 230A may be in a shape of a bracket, and each of the suspended segments 230B may have a first portion in a shape of a bow protruding toward the integrated circuit package component 200 and a second portion in a shape of a bow protruding away from the integrated circuit package component 200. A distance D8 may be between two the protruding portions of the suspended segments 230B. A ratio R5 of the distance D8 to the width W2 may be in a range of about 10% to about 400%.

Figure 17B:
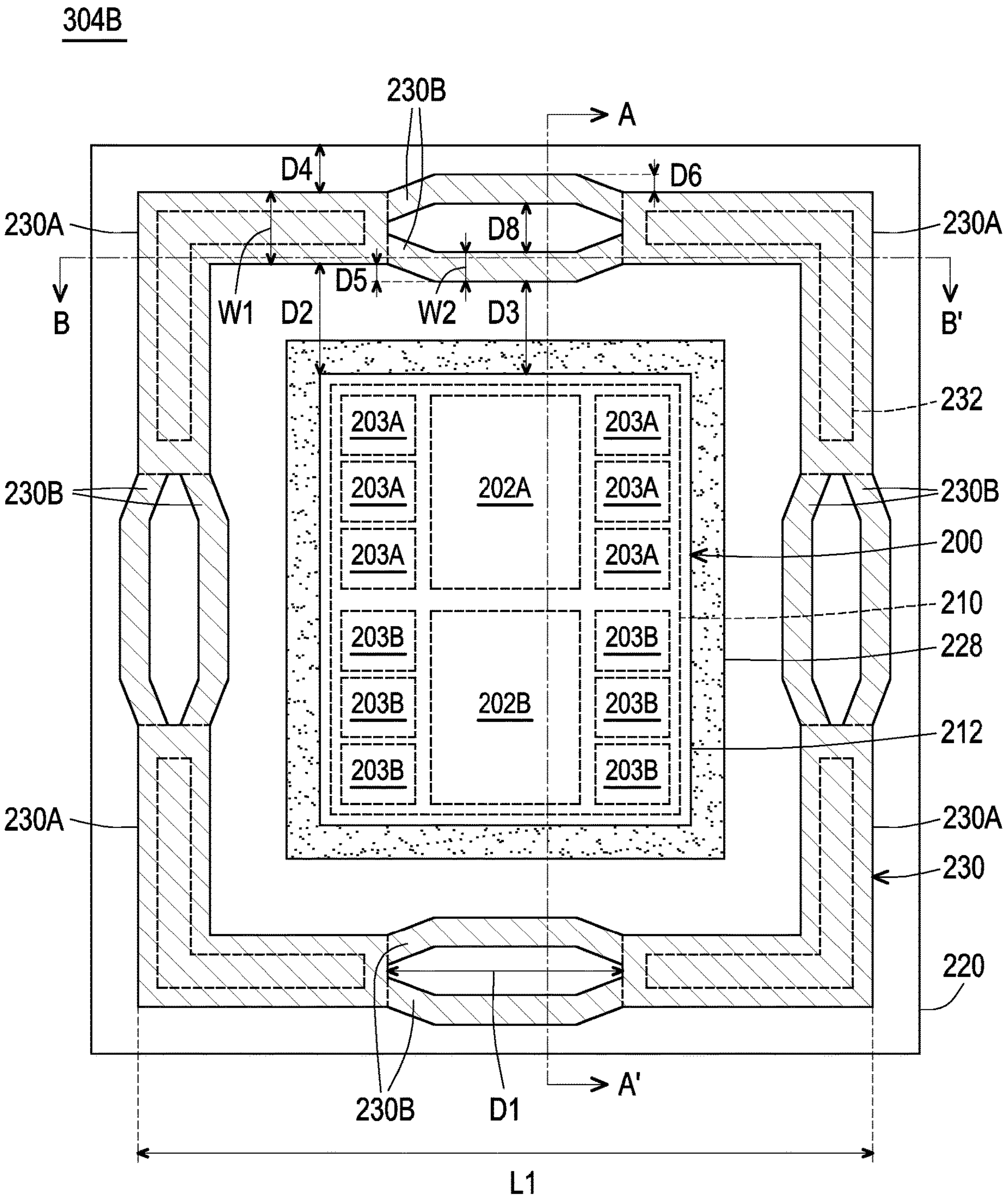

FIG. 17B shows an integrated circuit package 304B in accordance with some embodiments. The integrated circuit package 304B has a similar structure to the integrated circuit packages 300B and 304A shown in FIGS. 15D and 17A, wherein like reference numerals refer to like features. In the embodiment illustrated in FIG. 17B, the stiffener ring 230 in the integrated circuit package 300B may comprise four attached segments 230A interconnected by the suspended segments 230B. The attached segments 230A may be disposed at the corners of the package substrate 220. The suspended segments 230B may extend along the edges of the package substrate 220. Each of the attached segments 230A may be in a shape of an "L", and each of the suspended segments 230B may have a first portion in a shape of a bow protruding toward the integrated circuit package component 200 and a second portion in a shape of a bow protruding away from the integrated circuit package component 200.

Figure 18A:
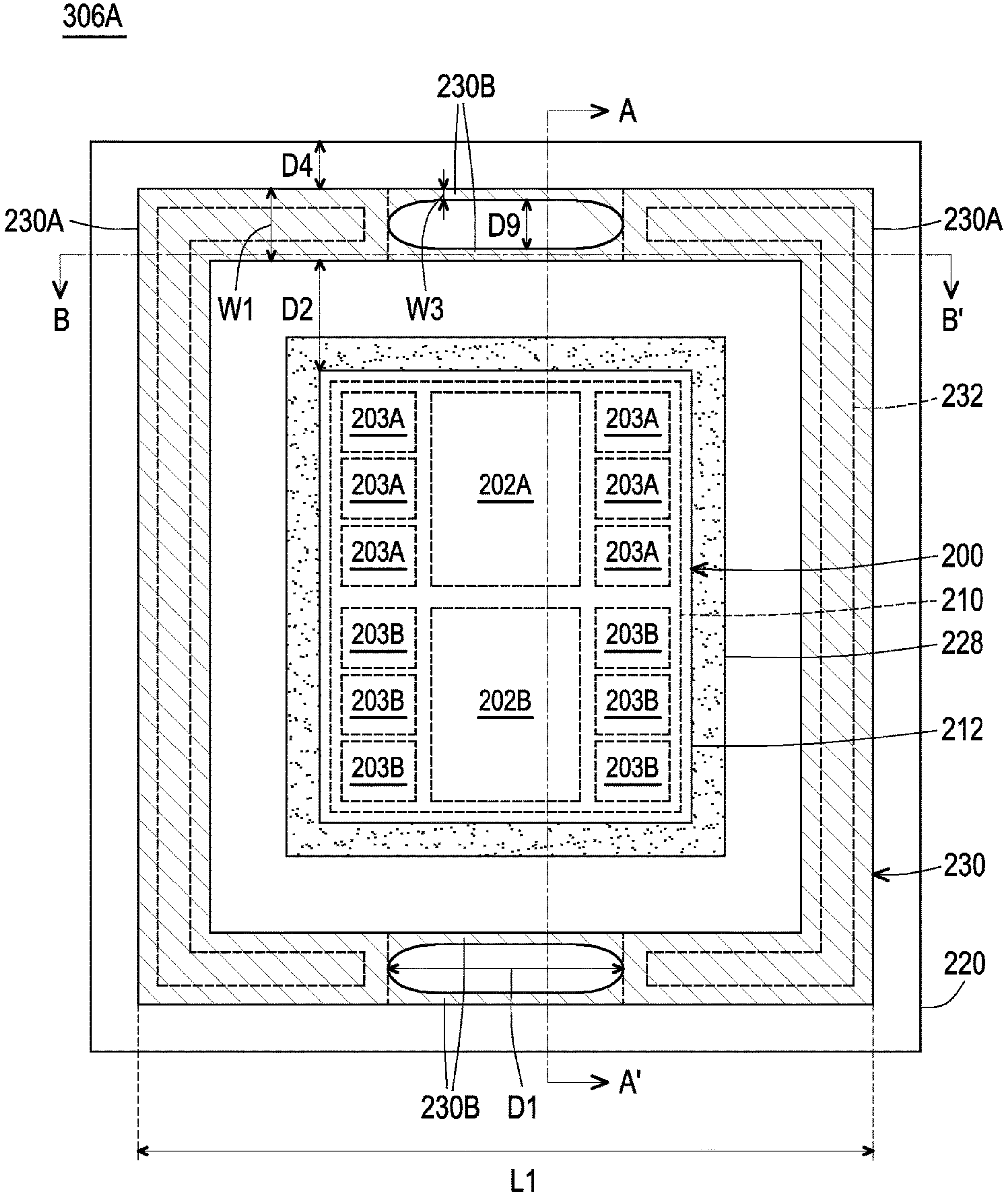

FIG. 18A shows an integrated circuit package 306A in accordance with some embodiments. The integrated circuit package 306A has a similar structure to the integrated circuit packages 304A shown in FIG. 17A, wherein like reference numerals refer to like features. In the embodiment illustrated in FIG. 18A, the stiffener ring 230 may comprise two attached segments 230A interconnected by the suspended segments 230B. The suspended segments 230B may extend along the opposite edges of the package substrate 220. Each of the attached segments 230A may be in a shape of a bracket, and each of the suspended segments 230B may comprise two or more strips spaced apart from each other. The embodiment illustrated in FIG. 18A illustrates two strips, and other embodiments may have more strips. Some strips of the suspended segments 230B in the integrated circuit package 304A may have sidewalls level with the outer sidewalls of the attached segments 230A, and some strips of the suspended segments 230B may have sidewalls level with the inner sidewalls of the attached segments 230A. The strips of the suspended segments 230B may have a width W3. A ratio R6 of the width W3 to the width W1 may be in a range of about 20% to about 40%. In some embodiments, the width W3 is smaller than the width W1. A distance D9 May be between two neighboring suspended segments 230B along the same edge of the package substrate 220. A ratio R7 of the distance D9 to the width W2 may be in a range of about 20% to about 80%.

Figure 18B:
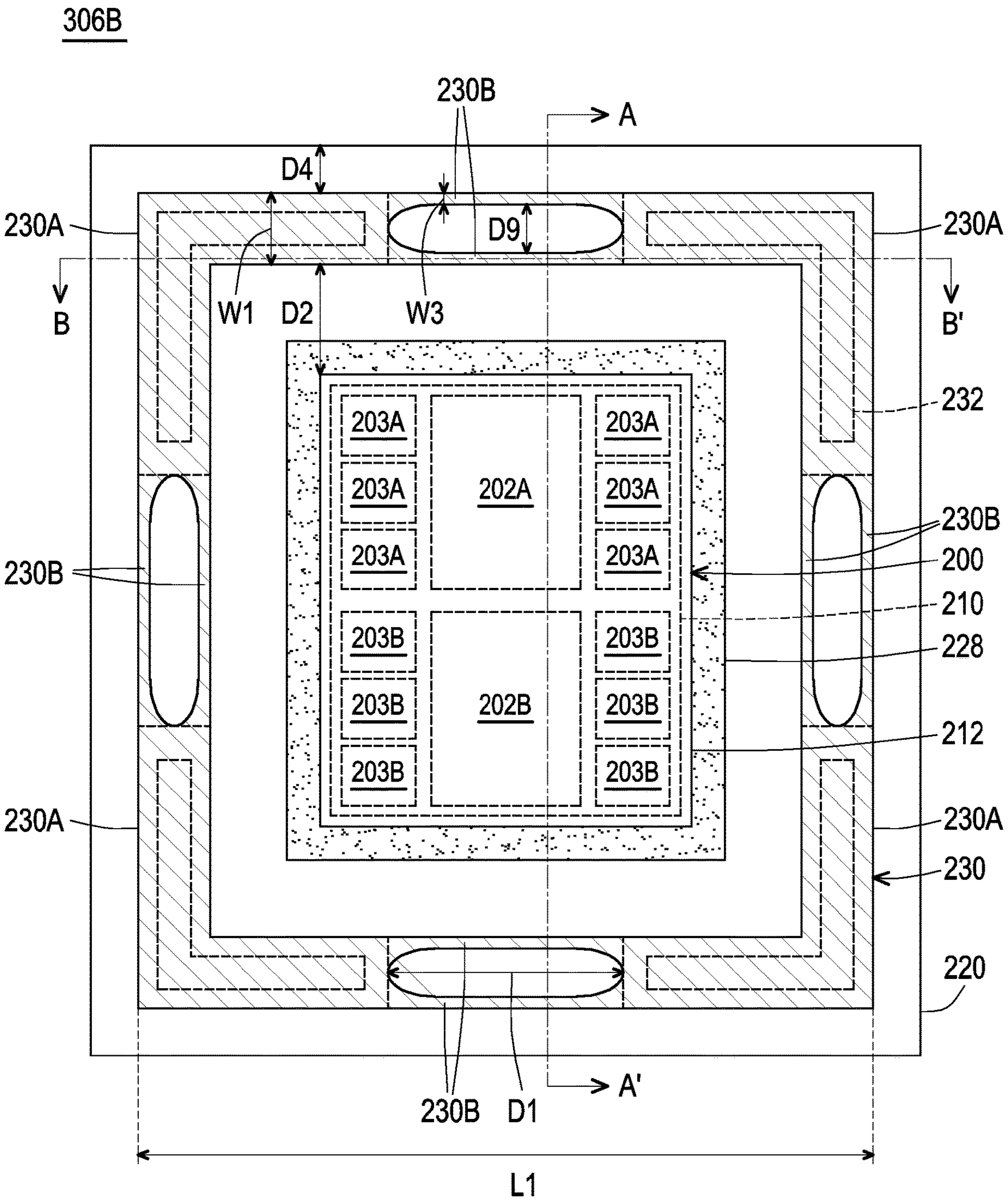

FIG. 18B shows an integrated circuit package 306B in accordance with some embodiments. The integrated circuit package 306B has a similar structure to the integrated circuit packages 304B and 306A shown in FIGS. 17B and 18A, wherein like reference numerals refer to like features. In the embodiment illustrated in FIG. 18B, the stiffener ring 230 in the integrated circuit package 300B may comprise four attached segments 230A interconnected by the suspended segments 230B. The attached segments 230A may be disposed at the corners of the package substrate 220. The suspended segments 230B may extend along the edges of the package substrate 220. Each of the attached segments 230A may be in a shape of a bracket, and each of the suspended segments 230B may comprise two or more strips spaced apart from each other. The embodiment illustrated in FIG. 18B illustrates two strips, and other embodiments may have more strips. Some strips of the suspended segments 230B in the integrated circuit package 304A may have sidewalls level with the outer sidewalls of the attached segments 230A, and some strips of the suspended segments 230B may have sidewalls level with the inner sidewalls of the attached segments 230A.

Figure 19A:
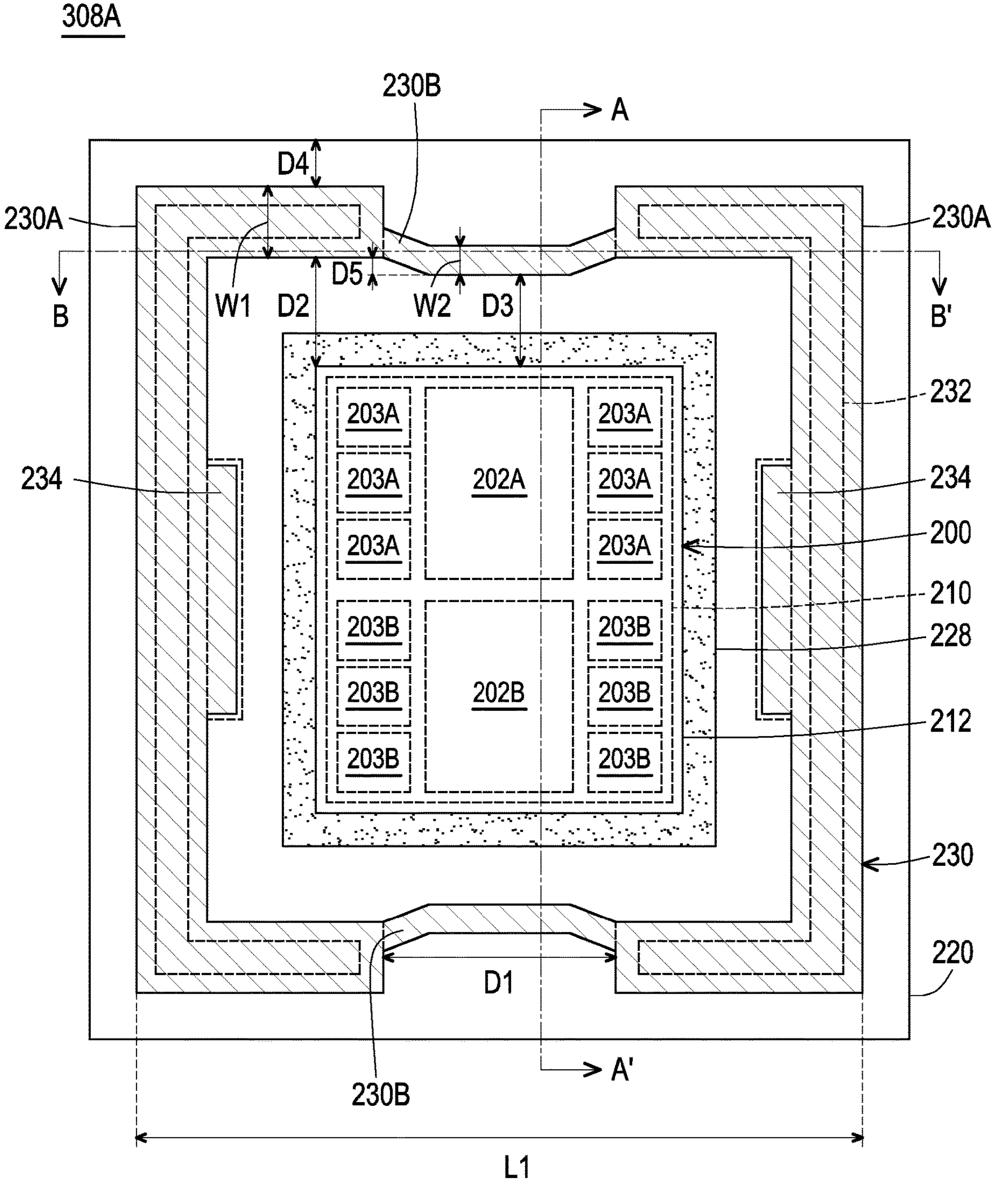

FIG. 19A shows an integrated circuit package 308A in accordance with some embodiments. The integrated circuit package 308A has a similar structure to the integrated circuit package 300A shown in FIGS. 15A, 15B, and 15C, wherein like reference numerals refer to like features. In the embodiment illustrated in FIG. 18A, the stiffener ring 230 may comprise two attached segments 230A interconnected by the suspended segments 230B. The attached segments 230A may each comprise a protrusion 234, which may protrude towards the integrated circuit package component 200 from the inner sidewalls of the attached segments 230A. The protrusions 234 are encircled in dashed lines in FIG. 19A for illustrative purposes. The protrusions 234 may be also attached to the package substrate 220 by the adhesive 232 and may reinforce the adhesion of the stiffener ring 230 to the package substrate 220. The suspended segments 230B may extend along the opposite edges of the package substrate 220. Each of the attached segments 230A may be in a shape of a bracket, and each of the suspended segments 230B may be in a shape of a bow. The stiffener rings 230 of the integrated circuit packages 302A, 304A, and 306A may also comprise the protrusions 234 as shown in the integrated circuit package 308A.

Figure 19B:
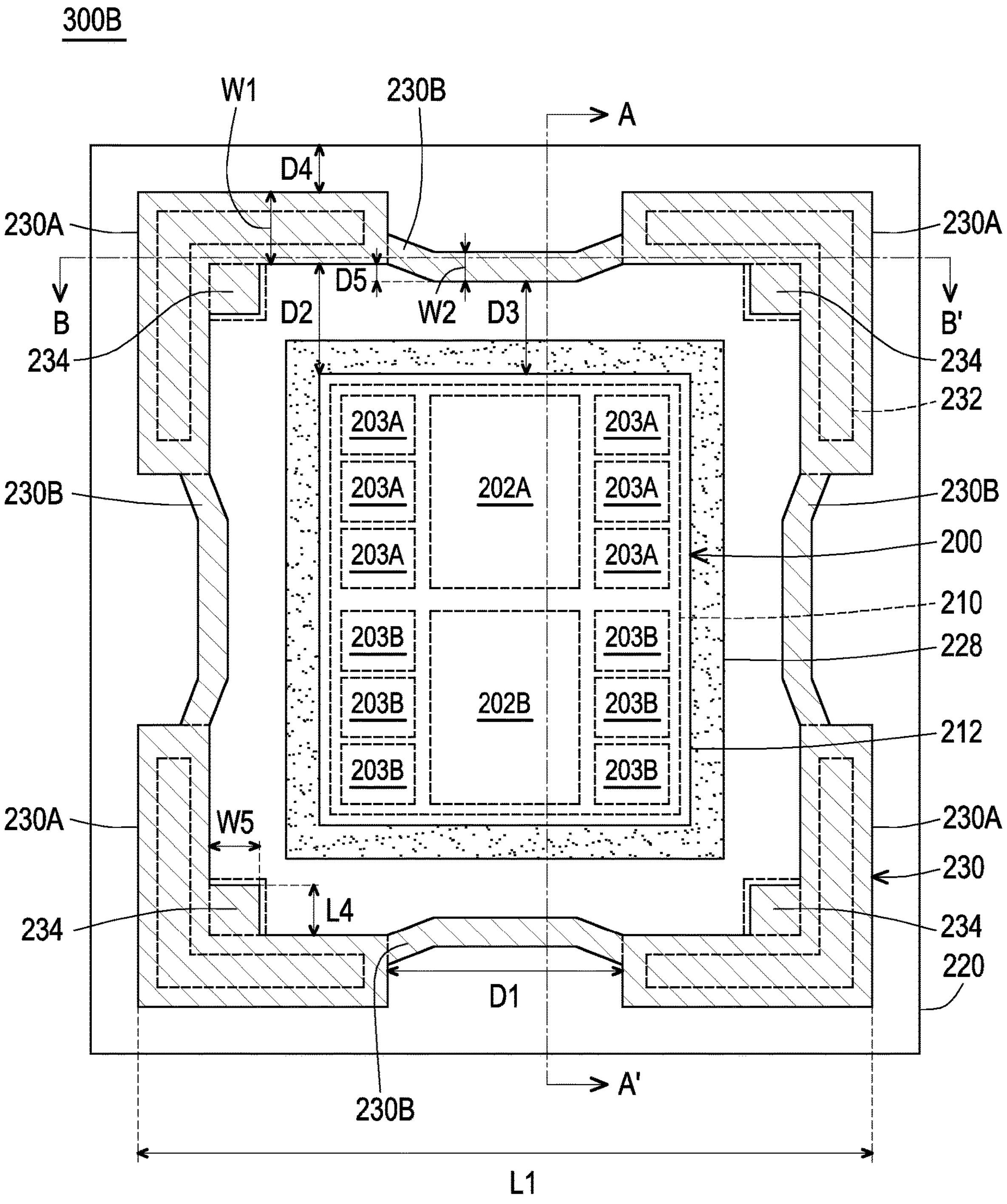

FIG. 19B shows an integrated circuit package 308B in accordance with some embodiments. The integrated circuit package 308B has a similar structure to the integrated circuit package 300B shown in FIG. 15D, wherein like reference numerals refer to like features. In the embodiment illustrated in FIG. 19B, the stiffener ring 230 in the integrated circuit package 300B may comprise four attached segments 230A interconnected by the suspended segments 230B. The attached segments 230A may be disposed at one or more of the corners of the package substrate 220. The attached segments 230A may each comprise a protrusion 234, which may protrude towards the integrated circuit package component 200 from the inner sidewalls of the attached segments 230A. The protrusions 234 are encircled in dashed lines in FIG. 19A for illustrative purposes. The protrusions 234 may be also attached to the package substrate 220 by the adhesive 232 and may reinforce the adhesion of the stiffener ring 230 to the package substrate 220. The suspended segments 230B may extend along the edges of the package substrate 220. Each of the attached segments 230A may be in a shape of an “L” and each of the suspended segments 230B may be in a shape of a bow. The stiffener rings 230 of the integrated circuit packages 300B, 302B, 304B, and 306B may also comprise the protrusions 234 as shown in the integrated circuit package 308B.

Figure 20A:
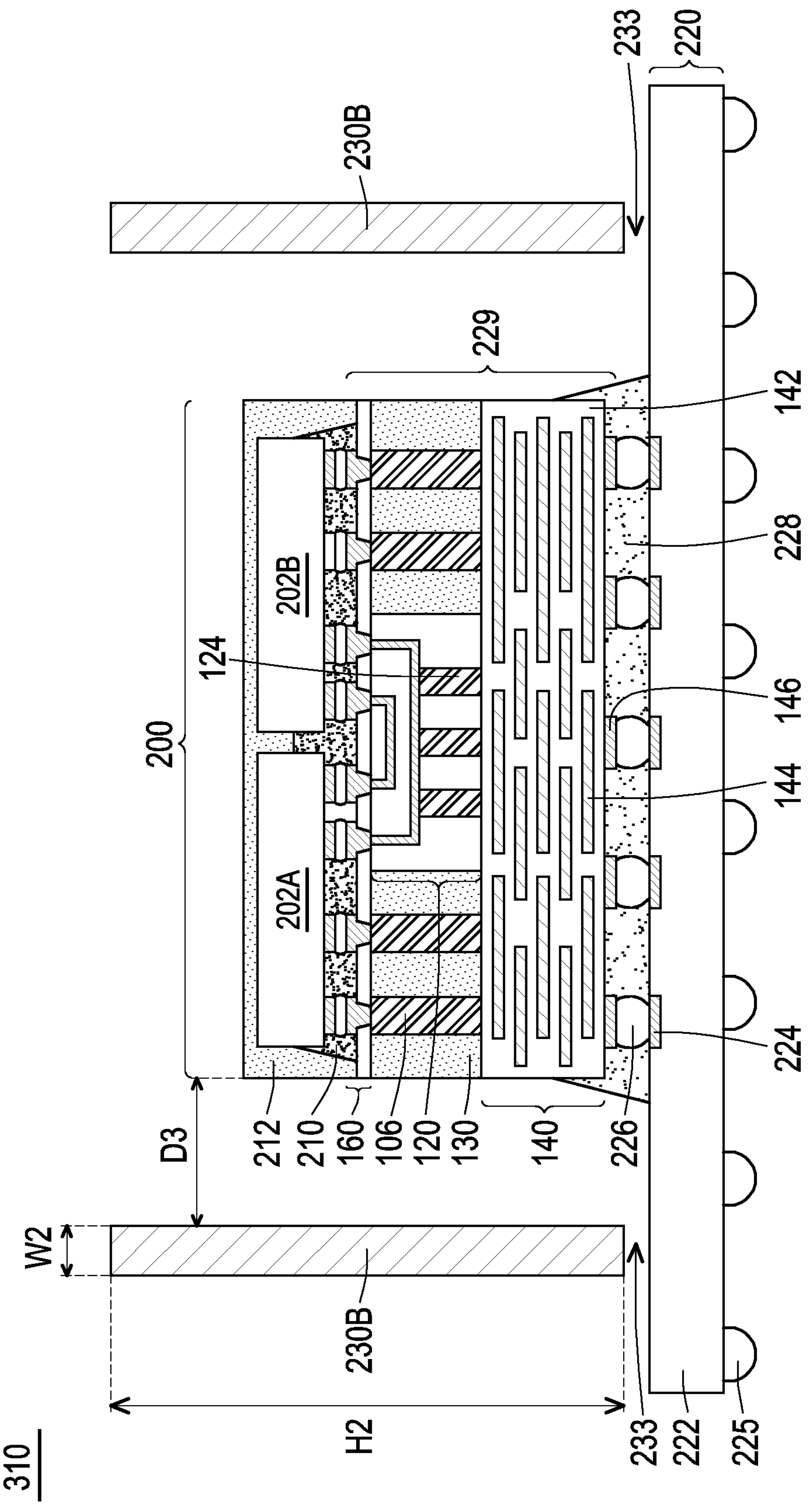
Figure 20B:
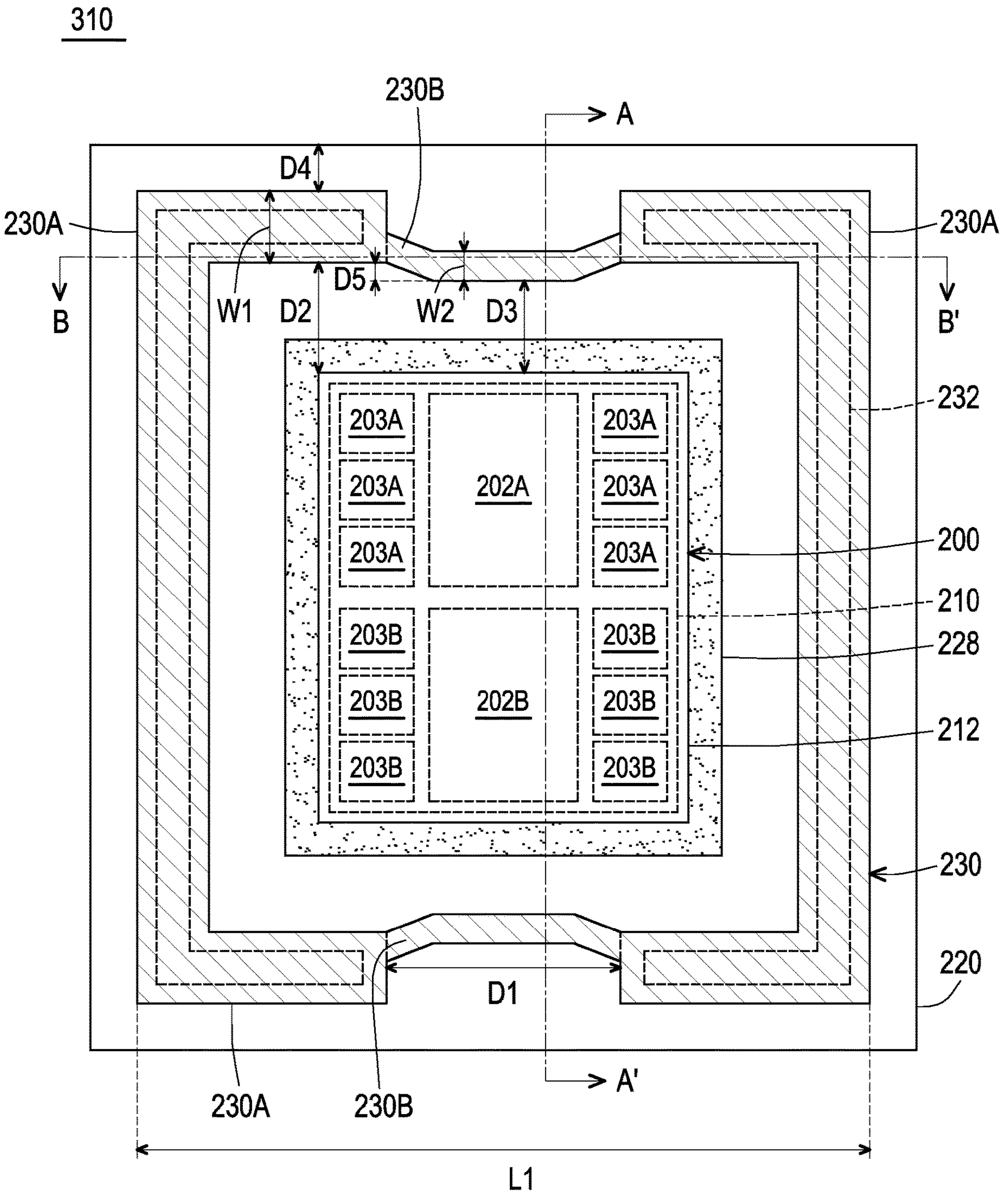
Figure 20C:
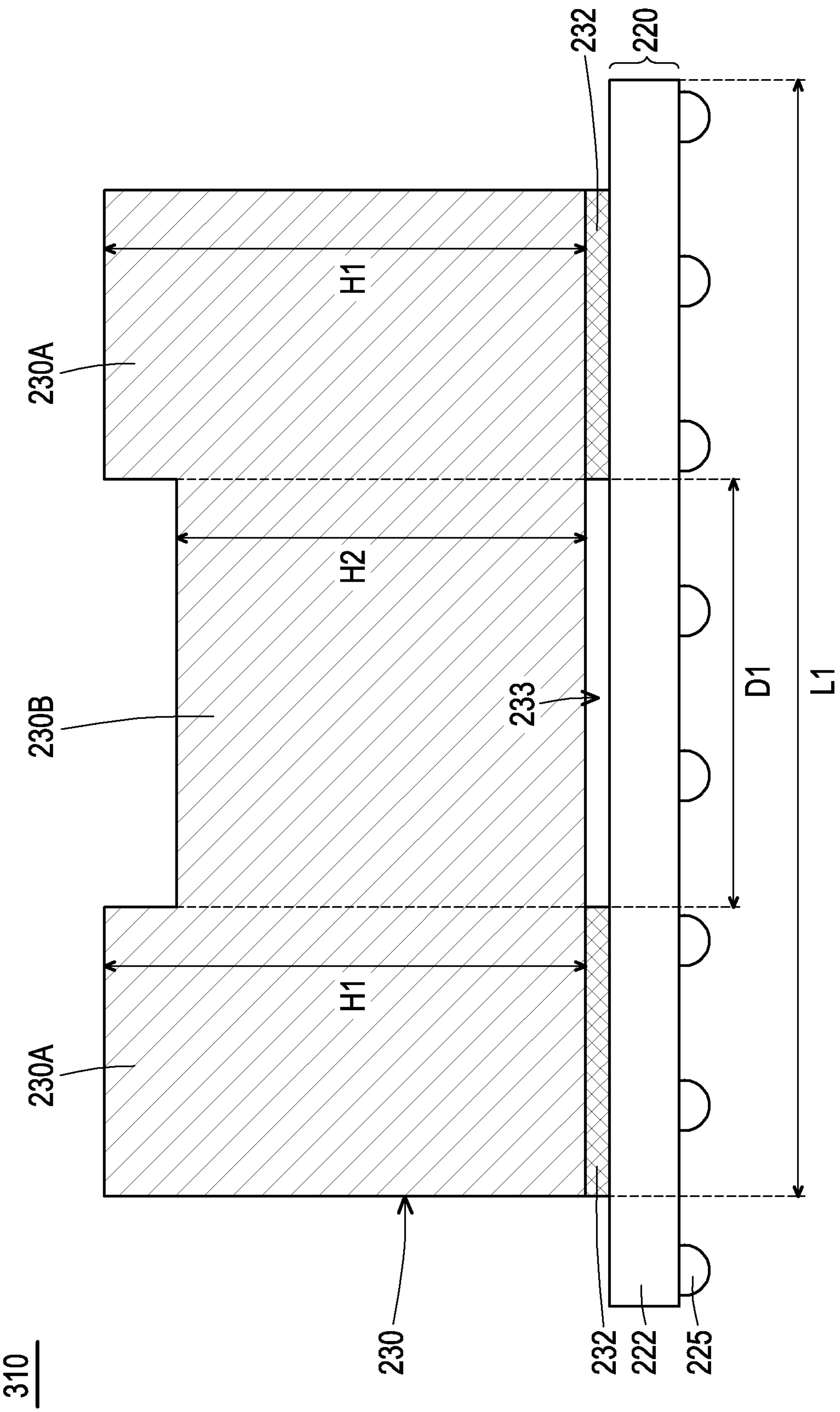

FIGS. 20A, 20B, and 20C show an integrated circuit package 310 in accordance with some embodiments. The integrated circuit package 310 has a similar structure to the integrated circuit package 300A shown in FIGS. 15A, 15B, and 15C, wherein like reference numerals refer to like features. In the embodiment illustrated in FIGS. 20A, 20B, and 20C, the attached segments 230A of the stiffener ring 230 may have the height H1 and the suspended segments 230B of the stiffener ring 230 may have a height H2 different from the height H1 as illustrated in FIG. 20C. In some embodiments, the height H2 is smaller than the height H1. A ratio R8 of the height H2 to the height H1 may be in a range of about 50% to about 80%. FIG. 20C shows the suspended segment 230B at a location where the bottom surface of the suspended segment 230B is level with the bottom surfaces of the attached segments 230A as an example. In some embodiments, a bottom surface of the suspended segment 230B may be disposed at a higher location relative to bottom surfaces of the attached segments 230A. The attached segments 230A and the suspended segments 230B of the stiffener rings 230 of the integrated circuit packages 300B, 302A, 302B, 304A, 304B, 306A, 306B, 308A, and 308B may also have similar heights as attached segments 230A and the suspended segments 230B of the stiffener rings 230 as shown in the integrated circuit package 310, respectively.

Embodiments may achieve certain advantages. By using the stiffener ring 230 comprising the suspended segments 230B in the integrated circuit packages 300A, 300B, 302A, 302B, 304A, 304B, 306A, 306B, 308A, 308B, and 310, the integrated circuit package component 200 and the package substrate 220 may have more freedom of movement when heated during operation and, the delamination and/or the cracking of the underfill 210 and/or the underfill 228 may be prevent or reduced. As a result the long-term reliability of the aforementioned integrated circuit packages comprising the stiffener ring 230 may be improved.

In an embodiment, a semiconductor package includes a substrate; an integrated circuit package component bonded to the substrate, wherein the integrated circuit package component includes a semiconductor die; and a ring structure on the substrate, wherein the ring structure encircles the integrated circuit package component in a top-down view, and wherein the ring structure includes a first attached segment attached to the substrate by an adhesive, wherein the first attached segment is spaced apart from the package component by a first distance; a second attached segment attached to the substrate by the adhesive, wherein the second attached segment is spaced apart from the package component by a second distance; and a first suspended segment between the first attached segment and the second attached segment, wherein the first suspended segment is suspended over the substrate, wherein the first suspended segment is spaced apart from the package component by a third distance, and wherein the third distance is different from the first distance and the second distance. In an embodiment, the third distance is smaller than the first distance and the second distance. In an embodiment, the third distance is larger than the first distance and the second distance. In an embodiment, a width of the first suspended segment is smaller than a width of the first attached segment and a width of the second attached segment. In an embodiment, a height of the first suspended segment is smaller than a height of the first attached segment and a height of the second attached segment. In an embodiment, the first attached segment, the second attached segment, and the first attached segment are a same piece of continuous material. In an embodiment, the first attached segment, the second attached segment, and the first suspended segment include copper. In an embodiment, the first suspended segment includes a first portion protruding toward the integrated circuit package component and a second portion protruding away from the integrated circuit package component.

In an embodiment, a semiconductor package includes a substrate including a first edge and a second edge, wherein the first edge intersects with the second edge; an integrated circuit package component bonded to the substrate, wherein the package component includes a semiconductor die; an underfill between the integrated circuit package component and the substrate; and a stiffener ring on the substrate, wherein the stiffener ring encircles the integrated circuit package component in a top-down view, and wherein a first portion of the stiffener ring extends along the first edge of the substrate, the first portion including a first attached segment with a first width, wherein a bottom surface of the first attached segment is covered by an adhesive; a second attached segment with a second width, wherein a bottom surface of the second attached segment is covered by the adhesive; and a first suspended segment extending from the first attached segment to the second attached segment, the first suspended segment having a third width, wherein the third width is smaller than the first width and the second width, wherein a bottom surface of the first suspended segment is free of the adhesive. In an embodiment, the first suspended segment protrudes towards the integrated circuit package component from an inner sidewall of the first attached segment and an inner sidewall of the second attached segment. In an embodiment, the first suspended segment protrudes away from the integrated circuit package component from an outer sidewall of the first attached segment and an outer sidewall of the second attached segment. In an embodiment, a second portion of the stiffener ring extends along the second edge of the substrate, the second portion including a third attached segment with a fourth width, wherein a bottom surface of the third attached segment is covered by the adhesive; a fourth attached segment with a fifth width, wherein a bottom surface of the fourth attached segment is covered by the adhesive; and a second suspended segment extending from the third attached segment to the fourth attached segment, the second suspended segment having with a sixth width, wherein the sixth width is smaller than the fourth width and the fifth width, wherein a bottom surface of the second suspended segment is free of the adhesive. In an embodiment, the first suspended segment includes a first portion and a second portion, each of the first portion and the second portion extending from the first attached segment to the second attached segment, the first portion being spaced apart from the second portion in the top-down view.

In an embodiment, a method of manufacturing a semiconductor package, the method includes bonding an integrated circuit package component to a substrate, wherein the integrated circuit package component includes a semiconductor die, and wherein the substrate includes a first edge and a second edge, wherein the first edge intersects with the second edge; placing an underfill between the integrated circuit package component and the substrate; and attaching a ring structure to the substrate, wherein the ring structure encircles the integrated circuit package component in a top-down view, and wherein a first portion of the ring structure extends along the first edge of the substrate, the first portion including a first attached segment connected to the substrate by an adhesive, wherein the first attached segment is spaced apart from the integrated circuit package component by a first distance; a second attached segment connected to the substrate by the adhesive, wherein the second attached segment is spaced apart from the integrated circuit package component by a second distance; and a first suspended segment between the first attached segment and the second attached segment, wherein the first suspended segment is in contact with the first attached segment and the second attached segment, wherein the first suspended segment is separated from the substrate by a first cavity, wherein the first suspended segment is spaced apart from the integrated circuit package component by a third distance, and wherein the third distance is different from the first distance and the second distance. In an embodiment, the third distance is smaller than the first distance and the second distance. In an embodiment, the third distance is larger than the first distance and the second distance. In an embodiment, a height of the first suspended segment is smaller than a height of the first attached segment and a height of the second attached segment. In an embodiment, a second portion of the ring structure extends along the second edge of the substrate, wherein the second portion includes a protrusion extending towards the package component, and wherein the protrusion is connected to the substrate by the adhesive. In an embodiment, a second portion of the ring structure extends along the second edge of the substrate, the second portion includes a third attached segment connected to the substrate by the adhesive; a fourth attached segment connected to the substrate by the adhesive; and a second suspended segment between the third attached segment and the fourth attached segment, wherein the second suspended segment is in contact with the third attached segment and the fourth attached segment, and wherein the second suspended segment is separated from the substrate by a second cavity. In an embodiment, the first portion and the second portion of the ring structure intersect at a first corner of the ring structure, and wherein the first corner includes a protrusion extending towards the integrated circuit package component, and wherein the protrusion is connected to the substrate by the adhesive.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
- a substrate;
- an integrated circuit package component bonded to the substrate, wherein the integrated circuit package component comprises a semiconductor die; and
- a ring structure on the substrate, wherein the ring structure encircles the integrated circuit package component in a top-down view, and wherein the ring structure comprises:
  - a first attached segment attached to the substrate by an adhesive, wherein the first attached segment is spaced apart from the package component by a first distance, and wherein the first attached segment has a first height along a first direction perpendicular to a top surface of the substrate;
  - a second attached segment attached to the substrate by the adhesive, wherein the second attached segment is spaced apart from the package component by a second distance, and wherein the second attached segment has a second height along the first direction; and a first suspended segment between the first attached segment and the second attached segment, wherein the first suspended segment is suspended over the substrate, wherein the first suspended segment is spaced apart from the package component by a third distance, wherein the third distance is different from the first distance and the second distance, wherein the first suspended segment has a third height along the first direction, and wherein the third height is less than the first height and the second height.

2. The semiconductor package of claim 1, wherein the third distance is smaller than the first distance and the second distance.

3. The semiconductor package of claim 1, wherein the third distance is larger than the first distance and the second distance.

4. The semiconductor package of claim 1, wherein a width of the first suspended segment is smaller than a width of the first attached segment and a width of the second attached segment.

5. The semiconductor package of claim 1, wherein the first attached segment, the second attached segment, and the first suspended segment are a same piece of continuous material.

6. The semiconductor package of claim 1, wherein the first attached segment, the second attached segment, and the first suspended segment comprise copper.

7. The semiconductor package of claim 1, wherein the first suspended segment comprises a first portion protruding toward the integrated circuit package component and a second portion protruding away from the integrated circuit package component.

8. A semiconductor package comprising:

a substrate comprising a first edge and a second edge, wherein the first edge intersects with the second edge;

an integrated circuit package component bonded to the substrate, wherein the package component comprises a semiconductor die;

an underfill between the integrated circuit package component and the substrate; and a stiffener ring on the substrate, wherein the stiffener ring encircles the integrated circuit package component in a top-down view, and wherein a first portion of the stiffener ring extends along the first edge of the substrate, the first portion comprising:

a first attached segment with a first width, wherein a bottom surface of the first attached segment is covered by an adhesive;

a second attached segment with a second width, wherein a bottom surface of the second attached segment is covered by the adhesive; and a first suspended segment extending from the first attached segment to the second attached segment, the first suspended segment having a third width, wherein the third width is smaller than the first width and the second width, wherein the first suspended segment has a bent shape in the top-down view, and wherein a bottom surface of the first suspended segment is free of the adhesive.

9. The semiconductor package of claim 8, wherein the first suspended segment bends towards the integrated circuit package component from an inner sidewall of the first attached segment and an inner sidewall of the second attached segment.

10. The semiconductor package of claim 8, wherein the first suspended segment protrudes away from the integrated circuit package component from an outer sidewall of the first attached segment and an outer sidewall of the second attached segment.

11. The semiconductor package of claim 8, wherein a second portion of the stiffener ring extends along the second edge of the substrate, the second portion comprising:

a third attached segment with a fourth width, wherein a bottom surface of the third attached segment is covered by the adhesive;

a fourth attached segment with a fifth width, wherein a bottom surface of the fourth attached segment is covered by the adhesive; and a second suspended segment extending from the third attached segment to the fourth attached segment, the second suspended segment having a sixth width, wherein the sixth width is smaller than the fourth width and the fifth width, wherein a bottom surface of the second suspended segment is free of the adhesive.

12. The semiconductor package of claim 8, wherein the first suspended segment comprises a first portion and a second portion, each of the first portion and the second portion extending from the first attached segment to the second attached segment, the first portion being spaced apart from the second portion in the top-down view.

13. A method of manufacturing a semiconductor package, the method comprising:

bonding an integrated circuit package component to a substrate, wherein the integrated circuit package component comprises a semiconductor die, and wherein the substrate comprises a first edge and a second edge, wherein the first edge intersects with the second edge;

placing an underfill between the integrated circuit package component and the substrate; and attaching a ring structure to the substrate, wherein the ring structure encircles the integrated circuit package component in a top-down view, and wherein a first portion of the ring structure extends along the first edge of the substrate, the first portion comprising:

a first attached segment connected to the substrate by an adhesive, wherein the first attached segment is spaced apart from a first edge of the integrated circuit package component by a first distance along a first direction perpendicular to the first edge of the integrated circuit package component in the top-down view;

a second attached segment connected to the substrate by the adhesive, wherein the second attached segment is spaced apart from the first edge of the integrated circuit package component by a second distance along the first direction; and a first suspended segment between the first attached segment and the second attached segment, wherein the first suspended segment is in contact with the first attached segment and the second attached segment, wherein the first suspended segment is separated from the substrate by a first cavity, wherein the first suspended segment is spaced apart from the first edge of the integrated circuit package component by a third distance along the first direction, and wherein the third distance is different from the first distance and the second distance.

14. The method of claim 13, wherein the third distance is smaller than the first distance and the second distance.

15. The method of claim 13, wherein the third distance is larger than the first distance and the second distance.

16. The method of claim 13, wherein a height of the first suspended segment is smaller than a height of the first attached segment and a height of the second attached segment.

17. The method of claim 13, wherein a second portion of the ring structure extends along the second edge of the substrate, wherein the second portion comprises a protrusion extending towards the package component, and wherein the protrusion is connected to the substrate by the adhesive.

18. The method of claim 13, wherein a second portion of the ring structure extends along the second edge of the substrate, the second portion comprising:

a third attached segment connected to the substrate by the adhesive;

a fourth attached segment connected to the substrate by the adhesive; and a second suspended segment between the third attached segment and the fourth attached segment, wherein the second suspended segment is in contact with the third attached segment and the fourth attached segment, and wherein the second suspended segment is separated from the substrate by a second cavity.

19. The method of claim 18, wherein the first portion and the second portion of the ring structure intersect at a first corner of the ring structure, and wherein the first corner comprises a protrusion extending towards the integrated circuit package component, and wherein the protrusion is connected to the substrate by the adhesive.

20. The semiconductor package of claim 1, wherein the first suspended segment has a bent shape in the top-down view.

* * * * *